United States Patent
Wakioka et al.

(10) Patent No.: US 12,139,576 B2
(45) Date of Patent: Nov. 12, 2024

(54) CURABLE RESIN COMPOSITION, ADHESIVE AGENT, ADHESIVE FILM, CIRCUIT SUBSTRATE, INTERLAYER INSULATING MATERIAL, AND PRINTED WIRING BOARD

(71) Applicant: SEKISUI CHEMICAL CO., LTD., Osaka (JP)

(72) Inventors: Sayaka Wakioka, Osaka (JP); Yuta Oatari, Osaka (JP); Kohei Takeda, Osaka (JP); Masami Shindo, Osaka (JP); Takashi Shinjo, Osaka (JP); Yuko Kawahara, Ibaraki (JP); Susumu Baba, Ibaraki (JP); Tatsushi Hayashi, Ibaraki (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 693 days.

(21) Appl. No.: 16/979,747

(22) PCT Filed: Mar. 15, 2019

(86) PCT No.: PCT/JP2019/010905
§ 371 (c)(1),
(2) Date: Sep. 10, 2020

(87) PCT Pub. No.: WO2019/188436
PCT Pub. Date: Oct. 3, 2019

(65) Prior Publication Data
US 2021/0009749 A1    Jan. 14, 2021

(30) Foreign Application Priority Data

Mar. 28, 2018  (JP) ................................. 2018-062502
May 18, 2018  (JP) ................................. 2018-096379

(51) Int. Cl.
| | |
|---|---|
| C08G 59/40 | (2006.01) |
| C08G 59/24 | (2006.01) |
| C08G 73/10 | (2006.01) |
| C08K 3/36 | (2006.01) |
| C08K 5/3445 | (2006.01) |
| C09J 7/35 | (2018.01) |
| C09J 163/00 | (2006.01) |
| C09J 179/08 | (2006.01) |
| H05K 1/03 | (2006.01) |
| H05K 3/46 | (2006.01) |

(52) U.S. Cl.
CPC ....... *C08G 59/4042* (2013.01); *C08G 59/245* (2013.01); *C08G 73/1082* (2013.01); *C08K 3/36* (2013.01); *C08K 5/3445* (2013.01); *C09J 7/35* (2018.01); *C09J 163/00* (2013.01); *C09J 179/08* (2013.01); *H05K 1/0373* (2013.01); *H05K 3/46* (2013.01); *C08G 2115/06* (2021.01)

(58) Field of Classification Search
CPC ............. C08G 59/4042; C08G 59/245; C08G 73/1082; C08G 2115/06; C09J 7/35; C09J 163/00; C09J 179/08; C08K 3/36; C08K 5/3445; H05K 1/0373; H05K 3/46
USPC ........................................................ 528/93
See application file for complete search history.

(56) References Cited

U.S. PATENT DOCUMENTS

| | | |
|---|---|---|
| 4,585,852 A | 4/1986 | Lo et al. |
| 5,147,943 A | 9/1992 | Inoue et al. |
| 5,891,367 A | 4/1999 | Basheer et al. |
| 7,157,587 B2 | 1/2007 | Mizori et al. |
| 7,208,566 B2 | 4/2007 | Mizori et al. |
| 2007/0074896 A1 | 4/2007 | Tanaka et al. |
| 2008/0058476 A1 | 3/2008 | Whiteker et al. |
| 2012/0059119 A1 | 3/2012 | Bito et al. |
| 2018/0002485 A1 | 1/2018 | Tanigawa et al. |

FOREIGN PATENT DOCUMENTS

| | | |
|---|---|---|
| CN | 106010420 | 10/2016 |
| EP | 1 918 341 | 5/2008 |
| JP | 61-270852 | 12/1986 |
| JP | 02-191623 | 7/1990 |

(Continued)

OTHER PUBLICATIONS

Saito et al., JP 2015-117278 A machine translation in English, Jun. 25, 2015. (Year: 2015).*
Tazaki et al., JP 2017-121807 A machine translation in English, Jul. 13, 2017. (Year: 2017).*
Shiotani et al., JP 2018-041961 A machine translation in English, Mar. 15, 2018. (Year: 2018).*
Extended European Search Report issued Nov. 24, 2021, in European Application No. 19777376.5.
Product Information of Imide Extended BMI, Designer Molecules Inc., Dec. 28, 2022, https://www.designermoleculesinc.com/products.cfm.

(Continued)

*Primary Examiner* — David T Karst
(74) *Attorney, Agent, or Firm* — Wenderoth, Lind & Ponack, L.L.P.

(57) ABSTRACT

A curable resin composition containing: a curable resin; and a curing agent containing an imide oligomer, the imide oligomer containing an aliphatic diamine residue- and/or aliphatic triamine residue-containing imide oligomer that has, in a main chain, an imide skeleton and a substituted or unsubstituted aliphatic diamine residue having a carbon number of 4 or greater and/or a substituted or unsubstituted aliphatic triamine residue having a carbon number of 4 or greater, has a crosslinkable functional group at an end, and has a molecular weight of 5,000 or less. The curable resin composition is excellent in flexibility and processability before curing and excellent in adhesiveness, heat resistance, and dielectric characteristics after curing. An adhesive, an adhesive film, a circuit board, an interlayer insulating material, and a printed wiring board each produced using the curable resin composition are also provided.

14 Claims, No Drawings

(56) References Cited

FOREIGN PATENT DOCUMENTS

| | | |
|---|---|---|
| JP | 7-224269 | 8/1995 |
| JP | 2000-109645 | 4/2000 |
| JP | 2001-316469 | 11/2001 |
| JP | 2002-93825 | 3/2002 |
| JP | 2004-502859 | 1/2004 |
| JP | 2004-323728 | 11/2004 |
| JP | 2007-91799 | 4/2007 |
| JP | 2007-091799 | 4/2007 |
| JP | 2008-063298 | 3/2008 |
| JP | 2008-255249 | 10/2008 |
| JP | 2009-258367 | 11/2009 |
| JP | 2010-001352 | 1/2010 |
| JP | 2011-42730 | 3/2011 |
| JP | 2011-222810 | 11/2011 |
| JP | 2012-1701 | 1/2012 |
| JP | 2012-67240 | 4/2012 |
| JP | 2012-097206 | 5/2012 |
| JP | 2013-199645 | 10/2013 |
| JP | 2014-194013 | 10/2014 |
| JP | 2015-117278 | 6/2015 |
| JP | 2015117278 A * | 6/2015 ............. C08G 59/40 |
| JP | 2016-020437 | 2/2016 |
| JP | 2016-41797 | 3/2016 |
| JP | 2016-069651 | 5/2016 |
| JP | 2016-131243 | 7/2016 |
| JP | 2016-147946 | 8/2016 |
| JP | 2016-172824 | 9/2016 |
| JP | 2016-203379 | 12/2016 |
| JP | 2017121807 A * | 7/2017 ............. B32B 15/04 |
| JP | 2018041961 A * | 3/2018 ............. B32B 15/08 |
| WO | 02/04572 | 1/2002 |
| WO | 2005/100433 | 10/2005 |
| WO | 2008/032669 | 3/2008 |
| WO | 2010/128667 | 11/2010 |
| WO | 2016/114286 | 7/2016 |
| WO | 2016/171101 | 10/2016 |
| WO | 2017/022191 | 2/2017 |
| WO | 2017/027482 | 2/2017 |

OTHER PUBLICATIONS

"Build Performance and Cost-Efficiency Into Your Formulation", Huntsman, Feb. 2022, https://huntsman-pimcore.equisolve-dev.com/Documents/Huntsman_Selector_guide_for_formulators.pdf.

International Search Report and International Preliminary Report on Patentability issued Mar. 20, 2018 in International (PCT) Application No. PCT/JP2018/002367.

International Search Report and International Preliminary Report on Patentability issued May 1, 2018 in International (PCT) Application No. PCT/JP2018/002368.

International Search Report issued May 21, 2019 in corresponding International (PCT) Application No. PCT/JP2019/010905.

* cited by examiner

CURABLE RESIN COMPOSITION, ADHESIVE AGENT, ADHESIVE FILM, CIRCUIT SUBSTRATE, INTERLAYER INSULATING MATERIAL, AND PRINTED WIRING BOARD

TECHNICAL FIELD

The present invention relates to a curable resin composition excellent in flexibility and processability before curing and excellent in adhesiveness, heat resistance, and dielectric characteristics after curing. The present invention also relates to an adhesive, an adhesive film, a circuit board, an interlayer insulating material, and a printed wiring board each produced using the curable resin composition.

BACKGROUND ART

Curable resins such as epoxy resins have low shrinkage and have excellent adhesiveness, insulation, and chemical resistance. Such curable resins are used in many industrial products. In particular, curable resin compositions that provide good results in a solder reflow test, which concerns short-term heat resistance, or in a thermal cycle test, which concerns repeated heat resistance, are used in many electronic device applications.

For example, Patent Literatures 1 and 2 each disclose a curable resin composition containing an epoxy resin and an imide oligomer as a curing agent. However, since imide oligomers are usually hard and brittle at room temperature, the curable resin compositions disclosed in Patent Literatures 1 and 2 are insufficient in flexibility, processability, fluidity, and the like at room temperature.

Patent Literature 3 discloses a curable resin composition with improved processability, improved fluidity, and the like, wherein the curable resin composition contains a liquid epoxy resin and an imide oligomer having a specific reactive functional group. The curable resin composition disclosed in Patent Literature 3, however, still does not have sufficient fluidity. Increasing the liquid epoxy resin content to further improve fluidity decreases heat resistance and adhesiveness.

Patent Literature 4 discloses a method of improving the flexibility of a curable resin composition before curing. The method includes dispersing a nitrile rubber component in a resin mixture containing an imide oligomer having a specific reactive functional group, an epoxy resin, and a bismaleimide-triazine resin. Unfortunately, the method disclosed in Patent Literature 4 reduces the heat resistance of the cured product due to the nitrile rubber component.

Interlayer insulating materials used for printed wiring boards and the like need dielectric characteristics such as a low dielectric constant and a low dielectric loss tangent. However, with the curable resin compositions that have been used in conventional interlayer insulating materials, it is difficult to achieve these dielectric characteristics while achieving adhesiveness and long-term heat resistance.

CITATION LIST

Patent Literature

Patent Literature 1: JP S61-270852 A
Patent Literature 2: JP 2004-502859 T
Patent Literature 3: JP 2007-91799 A
Patent Literature 4: JP H07-224269 A

SUMMARY OF INVENTION

Technical Problem

The present invention aims to provide a curable resin composition excellent in flexibility and processability before curing and excellent in adhesiveness, heat resistance, and dielectric characteristics after curing. The present invention also aims to provide an adhesive, an adhesive film, a circuit board, an interlayer insulating material, and a printed wiring board each produced using the curable resin composition.

Solution to Problem

The present invention relates to a curable resin composition containing: a curable resin; and a curing agent containing an imide oligomer, the imide oligomer containing an aliphatic diamine residue- and/or aliphatic triamine residue-containing imide oligomer that has, in a main chain, an imide skeleton and a substituted or unsubstituted aliphatic diamine residue having a carbon number of 4 or greater and/or a substituted or unsubstituted aliphatic triamine residue having a carbon number of 4 or greater, has a crosslinkable functional group at an end, and has a molecular weight of 5,000 or less.

The present invention is described in detail below.

The present inventors found out that a curable resin composition excellent in flexibility and processability before curing (B stage) and excellent in adhesiveness, heat resistance, and dielectric characteristics after curing can be produced by using, as a curing agent, an imide oligomer having a specific structure and a molecular weight equal to or lower than a specific value. The inventors thus completed the present invention.

The curable resin composition of the present invention contains a curing agent containing an imide oligomer.

The imide oligomer contains an aliphatic diamine residue- and/or aliphatic triamine residue-containing imide oligomer that has, in a main chain, an imide skeleton and a substituted or unsubstituted aliphatic diamine residue having a carbon number of 4 or greater and/or a substituted or unsubstituted aliphatic triamine residue having a carbon number of 4 or greater, has a crosslinkable functional group at an end, and has a molecular weight of 5,000 or less. Hereinafter, the aliphatic diamine residue- and/or aliphatic triamine residue-containing imide oligomer may also be referred to as an "imide oligomer according to the present invention".

The curable resin composition of the present invention containing the imide oligomer according to the present invention is excellent in flexibility and processability before curing and excellent in adhesiveness, heat resistance, and dielectric characteristics after curing.

The imide oligomer according to the present invention has a substituted or unsubstituted aliphatic diamine residue having a carbon number of 4 or greater (hereinafter also referred to simply as an "aliphatic diamine residue") and/or a substituted or unsubstituted aliphatic triamine residue having a carbon number of 4 or greater (hereinafter also referred to simply as an "aliphatic triamine residue"). In other words, in the imide oligomer according to the present invention, part or all of the amine from which the imide skeleton is derived consists of an aliphatic diamine and/or an aliphatic triamine. Since the imide oligomer according to the present invention has the aliphatic diamine residue and/or the aliphatic triamine residue, the imide oligomer according to the present invention can improve the flexibility and processability before curing and the dielectric characteristics after curing of the curable resin composition of the present invention.

The lower limit of the carbon number of the aliphatic diamine residue and the aliphatic triamine residue is 4. With the carbon number of the aliphatic diamine residue and aliphatic triamine residue being 4 or greater, the resulting curable resin composition is excellent in flexibility and processability before curing and dielectric characteristics after curing. The lower limit of the carbon number of the aliphatic diamine residue and the aliphatic triamine residue is preferably 5, more preferably 6.

There is no particular preferred upper limit for the carbon number of the aliphatic diamine residue and the aliphatic triamine residue, but the upper limit is practically 60.

Examples of the substituent in the case where the aliphatic diamine residue is substituted and in the case the aliphatic triamine residue is substituted include halogen atoms, linear or branched alkyl groups, linear or branched alkenyl groups, alicyclic groups, aryl groups, alkoxy groups, nitro groups, and cyano groups.

The aliphatic diamine and/or the aliphatic triamine from which the aliphatic diamine residue and/or the aliphatic triamine residue are/is derived may be, for example, an aliphatic diamine and/or a aliphatic triamine derived from a dimer acid and/or a trimer acid, a linear or branched aliphatic diamine and/or a linear or branched aliphatic triamine, an aliphatic ether diamine and/or an aliphatic ether triamine, or an aliphatic alicyclic diamine and/or an aliphatic alicyclic triamine.

Examples of the aliphatic diamine and/or aliphatic triamine derived from a dimer acid and/or a trimer acid include dimer diamines, hydrogenated dimer diamines, trimer triamines, and hydrogenated trimer triamines.

Examples of the linear or branched aliphatic diamine and/or linear or branched aliphatic triamine include 1,4-butanediamine, 1,6-hexanediamine, 1,8-octanediamine, 1,9-nonanediamine, 1,10-decanediamine, 1,11-undecanediamine, 1,12-dodecanediamine, 1,14-tetradecanediamine, 1,16-hexadecanediamine, 1,18-octadecanediamine, 1,20-eicosanediamine, 2-methyl-1,8-octanediamine, 2-methyl-1,9-nonanediamine, 2,7-dimethyl-1,8-octanediamine, 3,3'-diamino-N-methyldipropylamine, 3,3'-diaminodipropylamine, diethylenetriamine, bis(hexamethylene)triamine, and 2,2'-bis(methylamino)-N-methyldiethylamine.

Examples of the aliphatic ether diamine and/or aliphatic ether triamine include 2,2'-oxybis(ethylamine), 3,3'-oxybis(propylamine), and 1,2-bis(2-aminoethoxy)ethane.

Examples of the aliphatic alicyclic diamine and/or aliphatic alicyclic triamine include 1,3-bis(aminomethyl)cyclohexane, 1,4-bis(aminomethyl)cyclohexane, cyclohexanediamine, methylcyclohexanediamine, and isophoronediamine.

In particular, the aliphatic diamine residue and/or the aliphatic triamine residue are/is preferably an aliphatic diamine residue and/or an aliphatic triamine residue derived from a dimer acid and/or a trimer acid.

Commercial products of the aliphatic diamine and/or aliphatic triamine derived from a dimer acid and/or a trimer acid include, for example, aliphatic diamines and/or aliphatic triamines available from BASF and aliphatic diamines and/or aliphatic triamines available from Croda International plc.

Examples of the aliphatic diamine and/or aliphatic triamine available from BASF include Versamine 551 and Versamine 552.

Examples of the aliphatic diamine and/or aliphatic triamine available from Croda International plc include Priamine 1071, Priamine 1073, Priamine 1074, and Priamine 1075.

The lower limit of the proportion of the aliphatic diamine residue and/or the aliphatic triamine residue in the polyvalent amine residues contained in the entire imide oligomer is preferably 5 mol %. When the proportion of the aliphatic diamine residue and/or the aliphatic triamine residue is 5 mol % or more, the resulting curable resin composition is better flexibility and better processability before curing and dielectric characteristics after curing. The lower limit of the proportion of the aliphatic diamine residue and/or the aliphatic triamine residue is more preferably 10 mol %.

The proportion of the aliphatic diamine residue and/or the aliphatic triamine residue in the polyvalent amine residues may be 100 mol %. In other words, all the polyvalent amine residues may be the aliphatic diamine residue(s) and/or the aliphatic triamine residue(s). Yet, the upper limit of the proportion of the aliphatic diamine residue and/or the aliphatic triamine residue is preferably 80 mol %. When the proportion of the aliphatic diamine residue and/or aliphatic triamine residue is 80 mol % or less, the cured product has a high glass transition temperature, and thus has high heat resistance. The upper limit of the proportion of the aliphatic diamine residue and/or aliphatic triamine residue is more preferably 50 mol %.

For the cured product of the resulting curable resin composition to have a higher glass transition temperature and have better mechanical strength and better heat resistance, the imide oligomer may have a substituted or unsubstituted aromatic diamine residue in the main chain. In other words, some of the polyvalent amine residues contained in the imide oligomer according to the present invention may be an aromatic diamine residue. The imide oligomer may contain, in addition to the imide oligomer according to the present invention, an imide oligomer having an aromatic diamine residue in its main chain.

Examples of the substituent in the case where the aromatic diamine residue is substituted include halogen atoms, linear or branched alkyl groups, linear or branched alkenyl groups, alicyclic groups, aryl groups, alkoxy groups, nitro groups, and cyano groups.

Examples of the aromatic diamine from which the aromatic diamine residue is derived include 3,3'-diaminodiphenylmethane, 3,4'-diaminodiphenylmethane, 4,4'-diaminodiphenylmethane, 3,3'-diaminodiphenyl ether, 3,4'-diaminodiphenyl ether, 4,4'-diaminodiphenyl ether, o-phenylenediamine, m-phenylenediamine, p-phenylenediamine, 3,3'-diaminodiphenylsulfone, 4,4'-diaminodiphenylsulfone, 1,3-bis(3-aminophenoxy)benzene, 1,3-bis(4-aminophenoxy)benzene, 1,4-bis(4-aminophenoxy)benzene, bis(4-(4-aminophenoxy)phenyl)methane, 2,2-bis(4-(4-aminophenoxy)phenyl)propane, 1,3-bis(2-(4-aminophenyl)-2-propyl)benzene, 1,4-bis(2-(4-aminophenyl)-2-propyl)benzene, 3,3'-diamino-4,4'-dihydroxyphenylmethane, 4,4'-diamino-3,3'-dihydroxyphenylmethane, 3,3'-diamino-4,4'-dihydroxyphenyl ether, bisaminophenylfluorene, bistoluidinefluorene, 4,4'-bis(4-aminophenoxy)biphenyl, 4,4'-diamino-3,3'-dihydroxyphenyl ether, 3,3'-diamino-4,4'-dihydroxybiphenyl, and 4,4'-diamino-2,2'-dihydroxybiphenyl. Preferred among them are 4,4'-diaminodiphenylmethane, 4,4'-diaminodiphenyl ether, 1,3-bis(2-(4-aminophenyl)-2-propyl)benzene, 1,4-bis(2-(4-aminophenyl)-2-propyl)benzene, 1,3-bis(3-aminophenoxy)benzene, 1,3-bis(4-aminophenoxy)benzene, and 1,4-bis(4-aminophenoxy)benzene because they have excellent availability. To achieve better solubility and better heat resistance, more preferred are 1,3-bis(2-(4-aminophenyl)-2-propyl)benzene, 1,4-bis(2-(4-aminophenyl)-2-propyl)benzene, 1,3-bis(3-aminophenoxy)benzene, 1,3-bis(4-aminophenoxy)benzene, and 1,4-bis(4-aminophenoxy)benzene.

The aliphatic diamine residue- and/or aliphatic triamine residue-containing imide oligomer preferably has a substituted or unsubstituted tetracarboxylic acid residue in the main chain, and it more preferably contains a substituted or unsubstituted aromatic tetracarboxylic acid residue in the main chain to achieve better solubility and better heat resistance. In other words, in the imide oligomer according to the present invention, part or all of the carboxylic acid from which the imide skeleton is derived preferably consists of a tetracarboxylic acid, more preferably an aromatic tetracarboxylic acid.

Examples of the substituent in the case where the tetracarboxylic acid residue is substituted include halogen atoms, linear or branched alkyl groups, linear or branched alkenyl groups, alicyclic groups, aryl groups, alkoxy groups, nitro groups, and cyano groups.

Examples of the tetracarboxylic acid from which the tetracarboxylic acid residue is derived include pyromellitic acid, 3,3'-oxydiphthalic acid, 3,4'-oxydiphthalic acid, 4,4'-oxydiphthalic acid, 4,4'-(4,4'-isopropylidenediphenoxy)diphthalic acid, 4,4'-bis(2,3-dicarboxylphenoxy)diphenyl ether, p-phenylenebis(trimellitic acid monoester), and 2,3,3',4'-biphenyltetracarboxylic acid. In particular, to achieve better solubility and better heat resistance, the tetracarboxylic acid is preferably an aromatic tetracarboxylic acid whose acid dianhydride has a melting point of 240° C. or lower, more preferably an aromatic tetracarboxylic acid whose acid dianhydride has a melting point of 220° C. or lower, still more preferably an aromatic tetracarboxylic acid whose acid dianhydride has a melting point of 200° C. or lower, particularly preferably 3,4'-oxydiphthalic acid (melting point of acid dianhydride: 180° C.) and 4,4'-(4,4'-isopropylidenediphenoxy)diphthalic acid (melting point of acid dianhydride: 190° C.)

The "melting point" as used herein means an endothermic peak temperature during heating at 10° C./min using a differential scanning calorimeter. The differential scanning calorimeter may be, for example, EXTEAR DSC6100 (available from SII NanoTechnology Inc.).

The crosslinkable functional group is preferably a functional group capable of reacting with an epoxy group.

Specific examples of the crosslinkable functional group include an amino group, a carboxy group, an acid anhydride group, a phenolic hydroxy group, an unsaturated group, an active ester group, and a maleimide group. In particular, the crosslinkable functional group is more preferably at least one selected from the group consisting of an acid anhydride group, a phenolic hydroxy group, and an active ester group. The imide oligomer according to the present invention may have the crosslinkable functional group at some or all of the ends. When the imide oligomer has the crosslinkable functional group at all of the ends, the crosslinking density is increased, so that the resulting curable resin composition has a higher glass transition temperature after curing. When the imide oligomer has the crosslinkable functional group at only some of the ends, the functional group equivalent is increased, so that the amount of imide oligomer according to the present invention in the curable resin composition can be increased. The cured product of the resulting curable resin composition thus has excellent long-term heat resistance and the like.

Especially when the imide oligomer has the active ester group as the crosslinkable functional group, the cured product of the curable resin composition including the imide oligomer of the present invention as a curing agent has better dielectric characteristics such as a low dielectric constant and a low dielectric loss tangent.

The "active ester group" as used herein means an ester group that has an electron withdrawing group (e.g., an aromatic ring) on the side of the hydroxy group-derived oxygen atom among the oxygen atoms in the ester bond.

The imide oligomer according to the present invention preferably has a structure represented by any of the following formulas (1-1) to (1-3) or the following formulas (2-1) to (2-3) as a structure containing the crosslinkable functional group and the aliphatic diamine residue and/or the aliphatic triamine residue. When the imide oligomer has a structure represented by any of the following formulas (1-1) to (1-3) or the following formulas (2-1) to (2-3), the imide oligomer according to the present invention has better reactivity and compatibility with curable resins such as epoxy resins.

[Chem. 1]

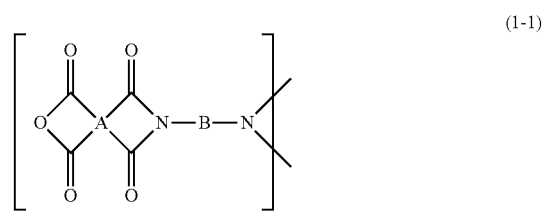

(1-1)

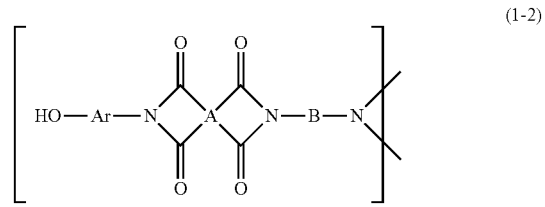

(1-2)

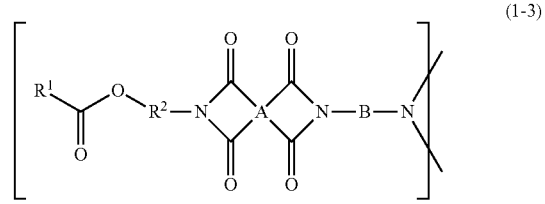

(1-3)

In the formulas (1-1) to (1-3), A is the tetracarboxylic acid residue and B is the aliphatic diamine residue. In the formula (1-2), Ar is a substituted or unsubstituted divalent aromatic group. In the formula (1-3), $R^1$ is an alkyl group having a carbon number of 1 or greater and 4 or smaller, a substituted or unsubstituted phenyl group, or a substituted or unsubstituted naphthyl group, and $R^2$ is a divalent organic group containing at least one aromatic ring.

[Chem. 2]

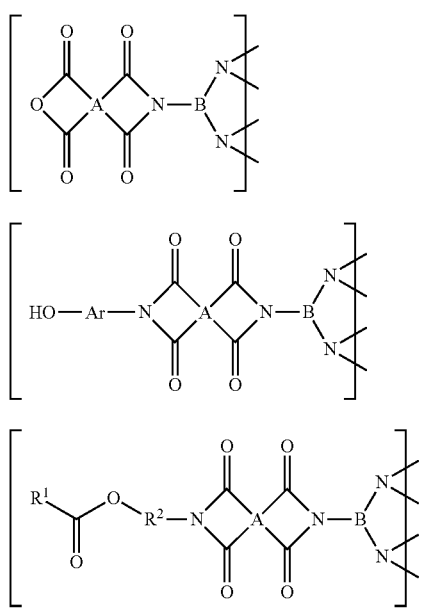

In the formulas (2-1) to (2-3), A is the tetracarboxylic acid residue and B is the aliphatic triamine residue. In the formula (2-2), Ar is a substituted or unsubstituted divalent aromatic group. In the formula (2-3), $R^1$ is an alkyl group having a carbon number of 1 or greater and 4 or smaller, a substituted or unsubstituted phenyl group, or a substituted or unsubstituted naphthyl group, and $R^2$ is a divalent organic group containing at least one aromatic ring.

To prevent a reduction in the glass transition temperature after curing and to prevent defective adhesion due to contamination of an adherend, the imide oligomer according to the present invention is preferably an imide oligomer having no siloxane skeleton in the structure.

The upper limit of the molecular weight of the imide oligomer according to the present invention is 5,000. With the molecular weight being 5,000 or less, the cured product of the resulting curable resin composition has excellent heat resistance. The upper limit of the molecular weight of the imide oligomer according to the present invention is preferably 4,000, more preferably 3,000.

The lower limit of the molecular weight of the imide oligomer according to the present invention is preferably 900, more preferably 950, still more preferably 1,000.

Herein, for a compound whose molecular structure is identifiable, the "molecular weight" means a molecular weight determined from the structural formula. For a compound having a broad distribution of degree of polymerization or a compound having an unidentifiable modified portion, the molecular weight may be expressed in a number average molecular weight. The "number average molecular weight" herein is a value determined in terms of polystyrene by gel permeation chromatography (GPC) using tetrahydrofuran as a solvent. The column used to measure the number average molecular weight in terms of polystyrene by GPC may be JAIGEL-2H-A (available from Japan Analytical Industry Co., Ltd.), for example.

When the imide oligomer according to the present invention is contained in the imide oligomer composition described later, the number average molecular weight of the imide oligomer according to the present invention means the number average molecular weight measured for the imide oligomer composition.

The imide oligomer according to the present invention preferably has a melting point of 120° C. or lower, more preferably 110° C. or lower, still more preferably 100° C. or lower from the standpoint of the handleability when the imide oligomer is used as a curing agent for the curable resin composition.

The lower limit of the melting point of the imide oligomer according to the present invention is not limited, but is preferably 30° C. or higher.

When the imide oligomer according to the present invention is contained in the imide oligomer composition described later, the melting point of the imide oligomer according to the present invention means the melting point measured for the imide oligomer composition.

Specifically, the imide oligomer according to the present invention is preferably an imide oligomer represented by the following formula (3-1), (3-2), (3-3), (3-4), or (3-5), an imide oligomer represented by the following formula (4-1), (4-2), (4-3), (4-4), or (4-5), or an imide oligomer represented by the following formula (5-1), (5-2), or (5-3).

[Chem. 3]

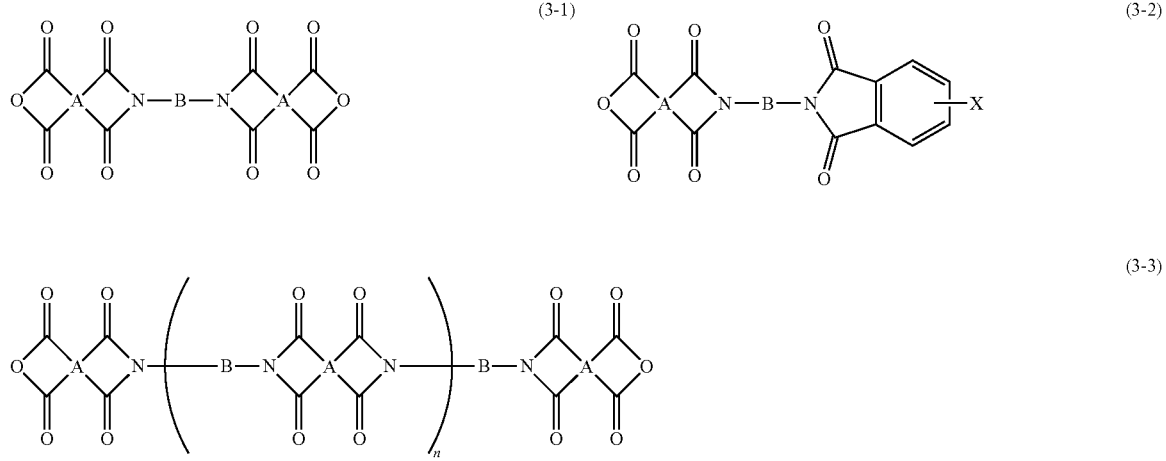

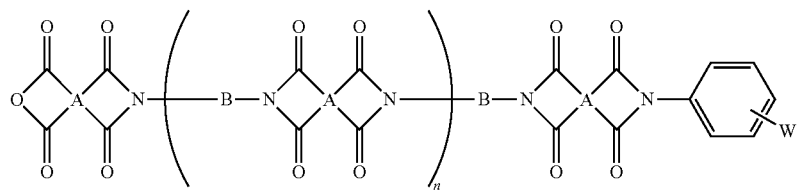
(3-4)

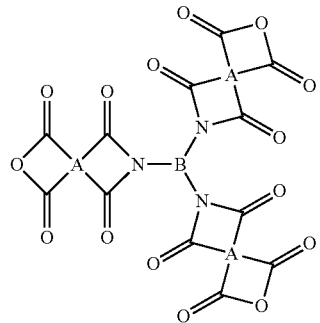
(3-5)

In the formulas (3-1) to (3-5), A is the tetracarboxylic acid residue. In each of the formulas (3-1), (3-3), (3-4), and (3-5), As may be the same as or different from each other. In the formulas (3-1) and (3-2), B is the aliphatic diamine residue. In the formula (3-3) and (3-4), B is the aliphatic diamine residue or the aromatic diamine residue. In each of the formula (3-3) and (3-4), at least either one of Bs is the aliphatic diamine residue. In the formula (3-5), B is the aliphatic triamine residue. In the formula (3-2), X is a hydrogen atom, a halogen atom, or a substituted or unsubstituted monovalent hydrocarbon group. In the formula (3-4), W is a hydrogen atom, a halogen atom, or a substituted or unsubstituted monovalent hydrocarbon group. In the formula (3-3) and (3-4), n is the number of repetitions.

[Chem. 4]

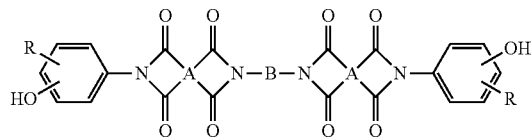
(4-1)

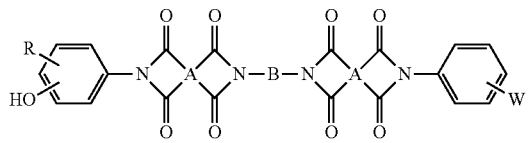
(4-2)

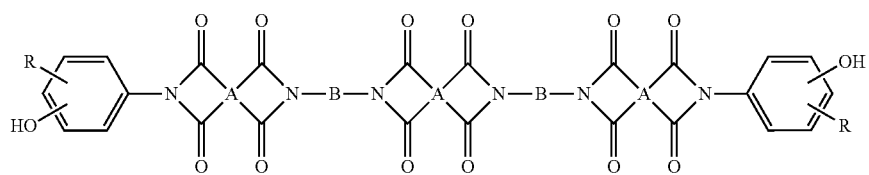
(4-3)

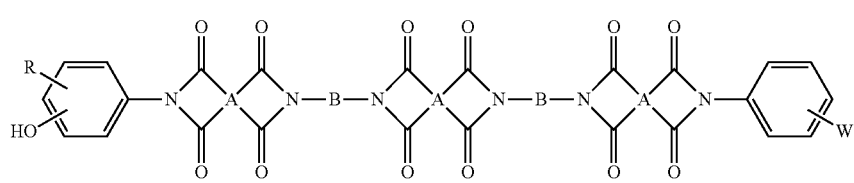
(4-4)

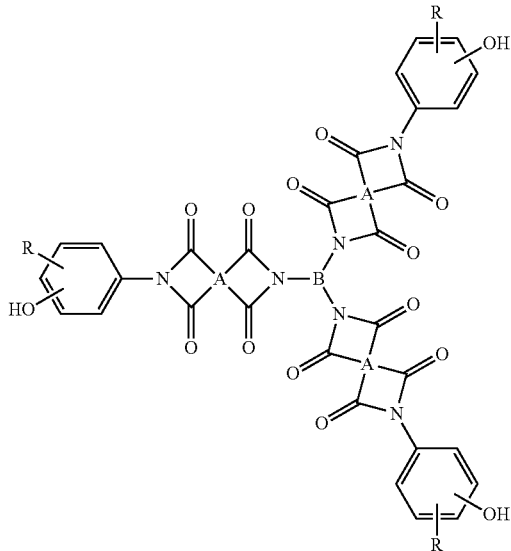

(4-5)

In the formulas (4-1) to (4-5), A is the tetracarboxylic acid residue. In each of the formulas (4-1) to (4-5), As may be the same as or different from each other. In the formulas (4-1) to (4-4), B is the aliphatic diamine residue or the aromatic diamine residue. In each of the formulas (4-3) and (4-4), at least either one of Bs is the aliphatic diamine residue. In the formula (4-5), B is the aliphatic triamine residue. In the formulas (4-1) to (4-5), R is a hydrogen atom, a halogen atom, or a substituted or unsubstituted monovalent hydrocarbon group. In each of the formulas (4-1) to (4-5), Rs may be the same as or different from each other. In the formulas (4-2) and (4-4), W is a hydrogen atom, a halogen atom, or a substituted or unsubstituted monovalent hydrocarbon group.

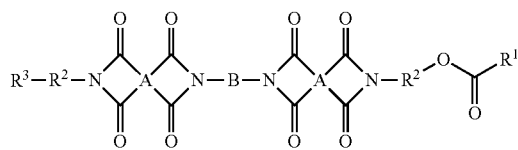

(5-1)

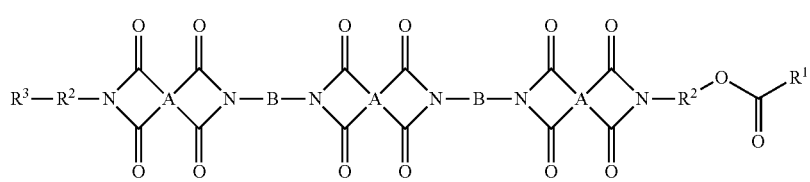

(5-2)

-continued

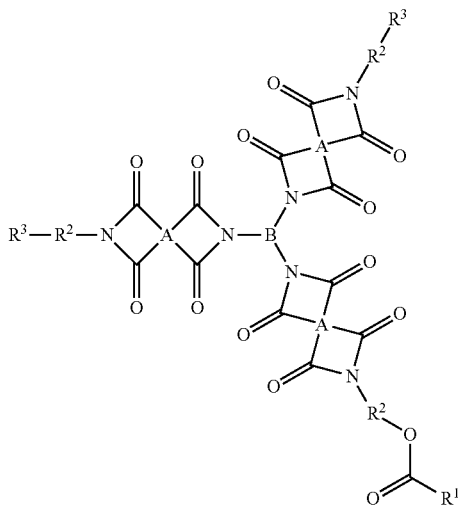

(5-3)

In the formulas (5-1) to (5-3), $R^1$ is an alkyl group having a carbon number of 1 or greater and 4 or smaller, a substituted or unsubstituted phenyl group, or a substituted or unsubstituted naphthyl group. In the formulas (5-1) to (5-3), $R^2$ is a divalent organic group containing at least one aromatic ring. In each of the formulas (5-1) to (5-3), $R^e$s may be the same as or different from each other.

In the formulas (5-1) to (5-3), $R^3$ is a hydroxy group or $R^1(C{=}O)O{-}$. In the formula (5-3), each $R^a$s may be the same as or different from each other.

In the formula (5-1), B is the aliphatic diamine residue. In the formula (5-2), B is the aliphatic diamine residue or the aromatic diamine residue. In the formula (5-2), at least either one of Bs is the aliphatic diamine residue. In the formula (5-3), B is the aliphatic triamine residue. In the formulas (5-1) to (5-3), A is a tetracarboxylic acid residue. In each of the formulas (5-1) to (5-3), As may be the same as or different from each other.

Among the imide oligomers according to the present invention, the imide oligomer having a structure represented by the formula (1-1) and/or the formula (2-1) may be produced by, for example, the following methods.

Specifically, methods that can be used include: a method involving reacting the acid dianhydride of the tetracarboxylic acid and the aliphatic diamine and/or the aliphatic triamine; and a method involving reacting the acid dianhydride of the tetracarboxylic acid, the aliphatic diamine and/or the aliphatic triamine, and the aromatic diamine.

The following shows a specific exemplary method for producing the imide oligomer having a structure represented by the formula (1-1) and/or the formula (2-1).

First, each amine compound is dissolved in a solvent in which the amic acid oligomer to be obtained by reaction can be dissolved (e.g., N-methylpyrrolidone). To the resulting solution is added the acid dianhydride of the tetracarboxylic acid, and the mixture is reacted to give an amic acid oligomer solution. Next, the solvent is removed by heating, pressure reduction, or the like. Then, the amic acid oligomer is reacted by heating at about 200° C. or higher for at least one hour. An imide oligomer having a desired number average molecular weight and having a structure represented by the formula (1-1) and/or the formula (2-1) at all the ends can be obtained by adjusting the molar ratio between the acid dianhydride of the tetracarboxylic acid and each amine compound and the imidization conditions.

By replacing part of the acid dianhydride of the tetracarboxylic acid with an acid anhydride represented by the following formula (6), it is possible to produce an imide oligomer having a desired number average molecular weight and having a structure of the formula (1-1) and/or the formula (2-1) at some of the ends and a structure derived from the acid anhydride of the following formula (6) at the other end(s). In this case, the acid dianhydride of the tetracarboxylic acid and the acid anhydride of the following formula (6) may be added at the same time or separately.

By replacing part of each amine compound with a monoamine of the following formula (7), it is possible to produce an imide oligomer having a desired number average molecular weight and having a structure of the formula (1-1) and/or the formula (2-1) at some of the ends and a structure derived from the monoamine of the following formula (7) at the other end(s). In this case, the aliphatic diamine and/or the aliphatic triamine, or the aliphatic diamine and/or the aliphatic triamine and the aromatic diamine, may be added at the same time as the monoamine of the following formula (7), or they may be added separately.

[Chem. 6]

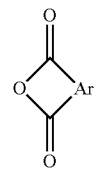

(6)

In the formula (6), Ar is a substituted or unsubstituted divalent aromatic group.

[Chem. 7]

(7)

In the formula (7), Ar is a substituted or unsubstituted monovalent aromatic group, and $R^3$ and $R^4$ are each independently a hydrogen atom or a monovalent hydrocarbon group.

Among the imide oligomers according to the present invention, the imide oligomer having a structure represented by the formula (1-2) and/or the formula (2-2) may be produced by, for example, the following methods.

Specifically, methods that can be used include: a method involving reacting the acid dianhydride of the tetracarboxylic acid, the aliphatic diamine and/or the aliphatic triamine, and a phenolic hydroxy group-containing monoamine represented by the following formula (8); and a method involving reacting the acid dianhydride of the tetracarboxylic acid, the aliphatic diamine and/or the aliphatic triamine, the aromatic diamine, and a phenolic hydroxy group-containing monoamine represented by the following formula (8).

[Chem. 8]

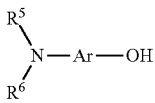
(8)

In the formula (8), Ar is a substituted or unsubstituted divalent aromatic group and $R^5$ and $R^6$ are each independently a hydrogen atom or a monovalent hydrocarbon group.

The following shows a specific exemplary method for producing the imide oligomer having a structure represented by the formula (1-2) and/or the formula (2-2).

First, each amine compound is dissolved in a solvent in which the amic acid oligomer to be obtained by reaction can be dissolved (e.g., N-methylpyrrolidone). To the resulting solution is added the acid dianhydride of the tetracarboxylic acid, and the mixture is reacted to give an amic acid oligomer solution. Next, the solvent is removed by heating, pressure reduction, or the like. Then, the amic acid oligomer is reacted by heating at about 200° C. or higher for at least one hour. An imide oligomer having a desired number average molecular weight and having a structure represented by the formula (1-2) and/or the formula (2-2) at all of the ends can be obtained by adjusting the molar ratio between the acid dianhydride of the tetracarboxylic acid and each amine compound and the imidization conditions.

By replacing part of the phenolic hydroxy group-containing monoamine of the formula (8) with a monoamine of the formula (7), it is possible to produce an imide oligomer having a desired number average molecular weight and having a structure represented by the formula (1-2) and/or the formula (2-2) at some of the ends and a structure derived from the monoamine of the formula (7) at the other end(s). In this case, the phenolic hydroxy group-containing monoamine of the formula (8) and the monoamine of the formula (7) may be added at the same time or separately.

Examples of the acid anhydride represented by the formula (6) include phthalic anhydride, 3-methylphthalic anhydride, 4-methylphthalic anhydride, 1,2-naphthalic anhydride, 2,3-naphthalic anhydride, 1,8-naphthalic anhydride, 2,3-anthracenedicarboxylic anhydride, 4-tert-butylphthalic anhydride, 4-ethynylphthalic anhydride, 4-phenylethynylphthalic anhydride, 4-fluorophthalic anhydride, 4-chlorophthalic anhydride, 4-bromophthalic anhydride, and 3,4-dichlorophthalic anhydride.

Examples of the monoamine represented by the formula (7) include aniline, o-toluidine, m-toluidine, p-toluidine, 2,4-dimethylaniline, 3,4-dimethylaniline, 3,5-dimethylaniline, 2-tert-butylaniline, 3-tert-butylaniline, 4-tert-butylaniline, 1-naphthylamine, 2-naphthylamine, 1-aminoanthracene, 2-aminoanthracene, 9-aminoanthracene, 1-aminopyrene, 3-chloroaniline, o-anisidine, m-anisidine, p-anisidine, 1-amino-2-methylnaphthalene, 2,3-dimethylaniline, 2,4-dimethylaniline, 2,5-dimethylaniline, 3,4-dimethylaniline, 4-ethylaniline, 4-ethynylaniline, 4-isopropylaniline, 4-(methylthio)aniline, and N,N-dimethyl-1,4-phenylenediamine.

Examples of the phenolic hydroxy group-containing monoamine represented by the formula (8) include 3-aminophenol, 4-aminophenol, 4-amino-o-cresol, 5-amino-o-cresol, 4-amino-2,3-xylenol, 4-amino-2,5-xylenol, 4-amino-2,6-xylenol, 4-amino-1-naphthol, 5-amino-2-naphthol, 6-amino-1-naphthol, and 4-amino-2,6-diphenylphenol. Preferred among them is 3-aminophenol.

Among the imide oligomers according to the present invention, the imide oligomer having a structure represented by the formula (1-3) and/or the formula (2-3) may be produced by, for example, the following method.

Specifically, a method that can be used involves: reacting the acid dianhydride of the tetracarboxylic acid, the aliphatic diamine and/or the aliphatic triamine, and a monoamine having a hydroxy group and the group represented by $R^2$ above; subsequently performing thermal or chemical imidization to give an imide oligomer having a phenolic hydroxy group end; and then reacting the obtained imide oligomer and a monocarboxylic acid having the group represented by $R^1$ above or a halide or anhydride thereof. In this case, the aromatic diamine may be used in addition to the aliphatic diamine and/or the aliphatic triamine and the monoamine having a hydroxy group and the group represented by $R^2$ above.

The following shows a specific exemplary method for producing the imide oligomer having a structure represented by the formula (1-3) and/or the formula (2-3).

First, each amine compound is dissolved in a solvent in which the amic acid oligomer to be obtained by reaction can be dissolved (e.g., N-methylpyrrolidone). To the resulting solution is added the acid dianhydride of the tetracarboxylic acid, and the mixture is reacted to give an amic acid oligomer solution. Next, a monocarboxylic acid having the group represented by $R^1$ above or a halide or anhydride thereof is added to the solution, followed by heating to allow imidization and esterification to proceed. Then, the solvent is removed by heating, pressure reduction, or the like. The imidization and esterification may proceed separately. In other words, the imide oligomer having a structure represented by the formula (1-2) and/or the formula (2-2) produced by the above method may be reacted with a monocarboxylic acid having the group represented by $R^1$ above or a halide or anhydride thereof. An imide oligomer having a desired number average molecular weight and having a structure represented by the formula (1-3) and/or the formula (2-3) can be obtained by adjusting the molar ratio between the acid dianhydride of the tetracarboxylic acid, each amine compound, and the monocarboxylic acid having the group represented by $R^1$ above or a halide or anhydride thereof, and the imidization and esterification conditions.

Examples of the monoamine having $R^2$ above and a hydroxy group include the same monoamines as the phenolic hydroxy group-containing monoamines represented by the formula (8). Preferred among them is 3-aminophenol.

Examples of the monocarboxylic acid having the group represented by $R^1$ above or a halide or anhydride thereof include benzoic acid, naphthalenecarboxylic acid, acetic acid, propionic acid, butyric acid, isobutyric acid, valeric acid, isovaleric acid, and pivalic acid, and halides and anhydrides thereof.

When produced by any of the above methods, the imide oligomer according to the present invention is obtained as a component of a mixture (imide oligomer composition) containing multiple types of imide oligomers and raw materials. When the imide oligomer composition has an imidization ratio of 70% or higher, the use of the imide oligomer composition as a curing agent leads to a cured product having better mechanical strength at high temperature and better long-term heat resistance.

The lower limit of the imidization ratio of the imide oligomer composition is preferably 75%, more preferably 80%. There is no particular preferred upper limit for the imidization ratio of the imide oligomer composition. Yet, the upper limit is practically 98%.

The "imidization ratio" is measured using a Fourier transform infrared spectrophotometer (FT-IR) by the attenuated total reflection method (ATR method). The imidization ratio can be determined using the following formula based on the peak absorbance area near 1660 cm$^{-1}$ derived from the carbonyl group of the amic acid. The Fourier transform infrared spectrophotometer may be UMA 600 (available from Agilent Technologies, Inc.), for example. The "Peak absorbance area of amic acid oligomer" in the following formula is the absorbance area of an amic acid oligomer prepared by reacting the acid dianhydride with the diamine or the phenolic hydroxy group-containing monoamine and then removing the solvent by evaporation or the like without the imidization step.

Imidization ratio (%)=100×(1−(Peak absorbance area after imidization)/(Peak absorbance area of amic acid oligomer))

From the standpoint of the solubility when the imide oligomer composition is used as a curing agent in a curable resin composition, the imide oligomer composition is preferably soluble in an amount of 3 g or more in 10 g of tetrahydrofuran at 25° C.

The lower limit of the amount of the imide oligomer in 100 parts by weight of the total of the curable resin and the curing agent containing an imide oligomer is preferably 5 parts by weight and the upper limit thereof is preferably 85 parts by weight. When the amount of the imide oligomer is within this range, the resulting curable resin composition has better flexibility and better processability before curing and better dielectric characteristics after curing. The lower limit of the amount of the imide oligomer is more preferably 8 parts by weight and the upper limit thereof is more preferably 80 parts by weight.

When the imide oligomer according to the present invention is contained in the above imide oligomer composition, the amount of the imide oligomer means the amount of the imide oligomer composition (in the case of further using other imide oligomer(s), the total of the imide oligomer composition and other imide oligomer(s)).

For purposes such as improving the processability in the uncured state, the curable resin composition of the present invention may contain a different curing agent in addition to the imide oligomer as long as it does not interfere with the purposes of the present invention.

Examples of the different curing agent include phenol curing agents, thiol curing agents, amine curing agents, acid anhydride curing agents, cyanate curing agents, and active ester curing agents. Preferred among them are phenol curing agents, acid anhydride curing agents, cyanate curing agents, and active ester curing agents.

When the curable resin composition of the present invention contains the different curing agent, the upper limit of the proportion of the different curing agent in the total amount of the curing agents is preferably 90% by weight, more preferably 80% by weight The curable resin composition of the present invention contains a curable resin.

Examples of the curable resin include epoxy resins, acrylic resins, phenolic resins, cyanate resins, isocyanate resins, maleimide resins, benzoxazine resins, silicone resins, and fluororesins. In particular, the curable resin preferably contains an epoxy resin. These curable resins may be used alone or in combination of two or more thereof.

The curable resin is preferably liquid or semi-solid at 25° C., more preferably liquid at 25° C. to achieve better processability when the curable resin composition is processed into a film or the like.

Examples of the epoxy resin include bisphenol A epoxy resins, bisphenol F epoxy resins, bisphenol E epoxy resins, bisphenol S epoxy resins, 2,2'-diallylbisphenol A epoxy resins, hydrogenated bisphenol epoxy resins, propylene oxide-added bisphenol A epoxy resins, resorcinol epoxy resins, biphenyl epoxy resins, sulfide epoxy resins, diphenyl ether epoxy resins, dicyclopentadiene epoxy resins, naphthalene epoxy resins, fluorene epoxy resins, naphthylene ether epoxy resins, phenol novolac epoxy resins, ortho-cresol novolac epoxy resins, dicyclopentadiene novolac epoxy resins, biphenyl novolac epoxy resins, naphthalene phenol novolac epoxy resins, glycidylamine epoxy resins, alkyl polyol epoxy resins, rubber-modified epoxy resins, and glycidyl ester compounds. Preferred among them are bisphenol A epoxy resins, bisphenol F epoxy resins, bisphenol E epoxy resins, and resorcinol epoxy resins because they have low viscosity that makes it easy to adjust the processability of the resulting curable resin composition at room temperature.

The curable resin composition of the present invention preferably contains a curing accelerator. When the curable resin composition contains the curing accelerator, the curing time can be shortened, improving productivity.

Examples of the curing accelerator include imidazole curing accelerators, tertiary amine curing accelerators, phosphine curing accelerators, photobase generators, and sulfonium salt curing accelerators. Preferred among them are imidazole curing accelerators and phosphine curing accelerators from the standpoint of storage stability and curability.

The curing accelerators may be used alone or in combination of two or more thereof.

The lower limit of the amount of the curing accelerator is preferably 0.8% by weight relative to the total weight of the curable resin, the curing agent containing an imide oligomer, and the curing accelerator. When the amount of the curing accelerator is 0.8% by weight or more, the effect of shortening the curing time is higher. The lower limit of the amount of the curing accelerator is more preferably 1% by weight.

From the standpoint of adhesiveness and the like, the upper limit of the amount of the curing accelerator is preferably 10% by weight, more preferably 2% by weight.

The curable resin composition of the present invention preferably contains an inorganic filler.

When the curable resin composition of the present invention contains the inorganic filler, the curable resin composition has better moisture absorption reflow resistance, better plating resistance, and better processability while maintaining excellent adhesiveness and excellent long-term heat resistance.

The inorganic filler is preferably at least one of silica or barium sulfate. When the curable resin composition of the present invention contains at least one of silica or barium sulfate as the inorganic filler, the curable resin composition has better moisture absorption reflow resistance, better plating resistance, and better processability.

Examples of inorganic fillers other than the silica and barium sulfate include alumina, aluminum nitride, boron nitride, silicon nitride, glass powder, glass frit, glass fiber, carbon fiber, and inorganic ion exchangers.

The inorganic fillers may be used alone or in combination of two or more thereof.

The lower limit of the average particle size of the inorganic filler is preferably 50 nm and the upper limit thereof is preferably 4 μm. When the average particle size of the inorganic filler is within this range, the resulting curable resin composition has better coating properties and better processability. The lower limit of the average particle size of the inorganic filler is more preferably 100 nm and the upper limit thereof is more preferably 3 μm.

The lower limit of the amount of the inorganic filler is preferably 10 parts by weight relative to 100 parts by weight of the total of the curable resin composition excluding, if used, the later-described solvent. The upper limit thereof is preferably 150 parts by weight. When the amount of the inorganic filler is within this range, the resulting curable resin composition has better moisture absorption reflow resistance, better plating resistance, and better processability. The lower limit of the amount of the inorganic filler is more preferably 20 parts by weight.

The curable resin composition of the present invention may contain a fluidity control agent for purposes such as improving the ability to quickly wet an adherend and improving the shape retainability.

Examples of the fluidity control agent include fumed silica such as AEROSIL and layered silicate.

The fluidity control agents may be used alone or in combination of two or more thereof.

The fluidity control agent preferably has an average particle size of smaller than 100 nm.

The lower limit of the amount of the fluidity control agent relative to 100 parts by weight of the total of the curable resin and the imide oligomer is preferably 0.1 parts by weight and the upper limit thereof is preferably 50 parts by weight. When the amount of the fluidity control agent is within this range, the effect of improving the ability to quickly wet an adherend, the shape retainability, and the like is higher. The lower limit of the amount of the fluidity control agent is more preferably 0.5 parts by weight and the upper limit thereof is more preferably 30 parts by weight.

The curable resin composition of the present invention may contain an organic filler for purposes such as stress relaxation or imparting toughness.

Examples of the organic filler include silicone rubber particles, acrylic rubber particles, urethane rubber particles, polyamide particles, polyamideimide particles, polyimide particles, benzoguanamine particles, and any of these particles with a core-shell structure. Preferred among them are polyamide particles, polyamideimide particles, and polyimide particles.

The organic fillers may be used alone or in combination of two or more thereof.

The upper limit of the amount of the organic filler is preferably 300 parts by weight relative to 100 parts by weight of the total of the curable resin composition excluding, if used, the later-described solvent. When the amount of the organic filler is within the range, the resulting curable resin composition has better toughness while maintaining excellent adhesiveness and the like. The upper limit of the amount of the organic filler is more preferably 200 parts by weight.

The curable resin composition of the present invention may contain a flame retardant.

Examples of the flame retardant include metal hydrates such as boehmite aluminum hydroxide, aluminum hydroxide, and magnesium hydroxide, halogen compounds, phosphorus compounds, and nitrogen compounds. Preferred among them is boehmite aluminum hydroxide.

The flame retardants may be used alone or in combination of two or more thereof.

The lower limit of the amount of the flame retardant relative to 100 parts by weight of the total of the curable resin and the imide oligomer is preferably 5 parts by weight and the upper limit thereof is preferably 200 parts by weight. When the amount of the flame retardant is within the range, the resulting curable resin composition has excellent incombustibility while maintaining adhesiveness and the like. The lower limit of the amount of the flame retardant is more preferably 10 parts by weight and the upper limit thereof is more preferably 150 parts by weight.

The curable resin composition of the present invention may contain a thermoplastic resin as long as it does not interfere with the purposes of the present invention. The use of the thermoplastic resin allows the curable resin composition of the present invention to have better flow characteristics, to more easily achieve both the filling properties and bleeding prevention properties in hot press bonding, and to have better flex resistance after curing.

Examples of the thermoplastic resin include polyimide resins, phenoxy resins, polyamide resins, polyamideimide resins, and polyvinyl acetal resins. Preferred among them are polyimide resins and phenoxy resins from the standpoint of heat resistance and handleability.

The thermoplastic resins may be used alone or in combination of two or more thereof.

The lower limit of the number average molecular weight of the thermoplastic resin is preferably 3,000 and the upper limit thereof is preferably 100,000. When the number average molecular weight of the thermoplastic resin is within this range, the resulting curable resin composition has better flow characteristics and better flex resistance after curing. The lower limit of the number average molecular weight of the thermoplastic resin is more preferably 5,000 and the upper limit thereof is more preferably 50,000.

The lower limit of the amount of the thermoplastic resin relative to 100 parts by weight of the total of the curable resin and the curing agent containing an imide oligomer (and the curing accelerator if contained) is preferably 2 parts by weight and the upper limit thereof is preferably 60 parts by weight. When the amount of the thermoplastic resin is 2 parts by weight or more, the resulting curable resin composition has better flow characteristics and better flex resistance after curing. When the amount of the thermoplastic resin is 60 parts by weight or less, the resulting curable resin composition has better adhesiveness and better heat resistance. The lower limit of the amount of the thermoplastic resin is more preferably 3 parts by weight and the upper limit thereof is more preferably 50 parts by weight.

The curable resin composition of the present invention may contain a solvent from the standpoint of coating properties and the like.

The solvent is preferably a nonpolar solvent having a boiling point of 120° C. or lower or an aprotic polar solvent having a boiling point of 120° C. or lower from the standpoint of the coating properties, the storage stability, and the like.

Examples of the nonpolar solvent having a boiling point of 120° C. or lower or the aprotic polar solvent having a boiling point of 120° C. or lower include ketone solvents, ester solvents, hydrocarbon solvents, halogen solvents, ether solvents, and nitrogen-containing solvents.

Examples of the ketone solvent include acetone, methyl ethyl ketone, and methyl isobutyl ketone.

Examples of the ester solvent include methyl acetate, ethyl acetate, isobutyl acetate.

Examples of the hydrocarbon solvent include benzene, toluene, normal hexane, isohexane, cyclohexane, methylcyclohexane, and normal heptane.

Examples of the halogen solvent include dichloromethane, chloroform, and trichloroethylene.

Examples of the ether solvent include diethyl ether, tetrahydrofuran, 1,4-dioxane, and 1,3-dioxolane.

Examples of the nitrogen-containing solvent include acetonitrile.

From the standpoint of the handleability, the solubility of the imide oligomer, and the like, the solvent is preferably at least one selected from the group consisting of a ketone solvent having a boiling point of 60° C. or higher, an ester solvent having a boiling point of 60° C. or higher, and an ether solvent having a boiling point of 60° C. or higher. Examples of such solvents include methyl ethyl ketone, methyl isobutyl ketone, ethyl acetate, isobutyl acetate, 1,4-dioxane, 1,3-dioxolane, and tetrahydrofuran.

The "boiling point" is a value measured at 101 kPa or a value converted to correspond to 101 kPa with a boiling point conversion chart, for example.

The lower limit of the amount of the solvent in the curable resin composition of the present invention is preferably 20% by weight and the upper limit thereof is preferably 90% by weight. When the amount of the solvent is within the range, the curable resin composition of the present invention has better coating properties and the like. The lower limit of the amount of the solvent is more preferably 30% by weight and the upper limit thereof is more preferably 80% by weight.

The curable resin composition of the present invention may contain a reactive diluent as long as it does not interfere with the purposes of the present invention.

From the standpoint of the adhesion reliability, the reactive diluent is preferably a reactive diluent having two or more reactive functional groups in one molecule.

The curable resin composition of the present invention may further contain additives such as a coupling agent, a dispersant, a storage stabilizer, a bleeding preventing agent, a flux, and a leveling agent.

The curable resin composition of the present invention may be produced by a method including mixing the curable resin, the imide oligomer, and optional ingredients such as a solvent using a mixer such as a homogenizing disperser, a universal mixer, a Banbury mixer, or a kneader.

A curable resin composition film containing the curable resin composition of the present invention can be obtained by applying the curable resin composition of the present invention to a substrate film and drying the curable resin composition. A cured product can be obtained by curing the curable resin composition film.

The curable resin composition of the present invention preferably has a glass transition temperature before curing of 0° C. or higher and lower than 25° C. When the glass transition temperature before curing is within this range, the curable resin composition of the present invention has better processability. The lower limit of the glass transition temperature before curing is more preferably 5° C. and the upper limit thereof is more preferably 23° C.

The "glass transition temperature before curing" herein can be determined by analyzing the curable resin composition (not containing a solvent) using a differential scanning calorimeter (DSC) under the heating conditions of from −20° C. to 100° C. at a rate of temperature rise of 10° C./min. The glass transition temperature before curing is determined using the above curable resin film with a thickness of 400 µm.

The cured product of the curable resin composition of the present invention preferably has a glass transition temperature of 100° C. or higher and lower than 250° C. When the glass transition temperature of the cured product is within this range, the cured product of the curable resin composition of the present invention has better mechanical strength and better long-term heat resistance. The lower limit of the glass transition temperature of the cured product is more preferably 120° C. and the upper limit thereof is more preferably 230° C.

The "glass transition temperature of the cured product" herein can be determined as a peak temperature from a tan δ curve measured using a dynamic viscoelastometer under the heating conditions of from −0° C. to 300° C. at a rate of temperature rise of 10° C./min, a frequency of 10 Hz, and a chuck distance of 24 mm. The dynamic viscoelastometer may be RHEOVIBRON Automatic Dynamic Viscoelastometer DDV-GP series (available from A&D Company, Limited), for example. The cured product for determining the glass transition temperature can be obtained by heating the above curable resin composition film with a thickness of 400 µm at 190° C. for 30 minutes.

The cured product of the curable resin composition of the present invention preferably has an initial adhesive force to polyimide of 3.4 N/cm or more. When the initial adhesive force of the cured product to polyimide is 3.4 N/cm or more, the curable resin composition of the present invention can be suitably used in adhesives for coverlays of flexible print circuit substrates and the like. The initial adhesive force of the cured product to polyimide is more preferably 5 N/cm or more, still more preferably 6 N/cm or more.

The initial adhesive force to polyimide can be measured as the peel strength by subjecting a specimen cut to a width of 1 cm to T-peeling using a tensile tester at 25° C. and a peeling rate of 20 ram/min. The specimen is obtained by stacking polyimide films, each having a thickness of 50 µm, on both surface of a curable resin composition film with a thickness of 20 µm and heating the stack at 190° C. for one hour. The initial adhesive force means a value measured within 24 hours after the specimen preparation. The curable resin composition film can be obtained by applying the curable resin composition to a substrate film and drying the composition. The polyimide may be Kapton 200H (available from Du Pont-Toray Co., Ltd., surface roughness 0.03 to 0.07 μm). The tensile tester may be UCT-500 (available from Orientec Co., Ltd.), for example.

The cured product of the curable resin composition of the present invention preferably has an adhesive force to polyimide of 3.4 N/cm or more after storage at 200° C. for 100 hours. When the adhesive force to polyimide of the cured product after storage at 200° C. for 100 hours is 3.4 N/cm or more, the curable resin composition of the present invention can be used in heat-resistant adhesives for in-vehicle uses and the like. The adhesive force to polyimide of the cured product after storage at 200° C. for 100 hours is more preferably 5 N/cm or more, still more preferably 6 N/cm or more.

The adhesive force to polyimide of the cured product after storage at 200° C. for 100 hours means a value obtained by preparing a specimen in the same manner as in the measurement of the above initial adhesive force, storing the specimen at 200° C. for 100 hours, then cooling it to 25° C., and measuring the adhesive force by the same method as for the initial adhesive force within 24 hours after the cooling.

The upper limit of the dielectric loss tangent at 23° C. of the cured product of the curable resin composition of the present invention is preferably 0.0045. When the dielectric loss tangent at 23° C. of the cured product is within this range, the curable resin composition of the present invention can be suitably used in interlayer insulating materials of multilayer printed wiring boards and the like. The upper limit of the dielectric loss tangent at 23° C. of the cured product is more preferably 0.0040, still more preferably 0.0035.

The "dielectric loss tangent" is a value measured at 1.0 GHz using a dielectric constant measuring device and a network analyzer. The cured product for measuring the "dielectric loss tangent" can be obtained by heating the above curable resin composition film with a thickness of 40 to 200 μm at 190° C. for 90 minutes.

The curable resin composition of the present invention can be used in a wide range of applications, and can be particularly suitably used in electronic material applications that require high heat resistance. For example, the curable resin composition can be used in die attach agents in aircraft or in-vehicle electronic control unit (ECU) applications and SiC- or GaN-containing power device applications. The curable resin composition can also be used in: adhesives for power overlay packaging; adhesives for printed wiring boards; adhesives for coverlays of flexible printed circuit boards; copper clad laminates; adhesives for semiconductor bonding; interlayer insulating materials; pre-pregs; sealants for LEDs; and adhesives for structure materials; and the like.

In particular, the curable resin composition is suitably used in adhesive applications. An adhesive containing the curable resin composition of the present invention is also encompassed by the present invention.

The curable resin film can be suitably used as an adhesive film. The present invention encompasses an adhesive film produced using the curable resin composition of the present invention.

The present invention encompasses a circuit board including a cured product of the curable resin composition.

The cured product of the curable resin composition of the present invention has a low dielectric constant and a low dielectric loss tangent, thus exhibiting excellent dielectric characteristics. The curable resin composition thus can be suitably used in interlayer insulating materials of multilayer printed wiring boards and the like. The present invention encompasses an interlayer insulating material produced using the curable resin composition of the present invention.

The present invention encompasses a multilayer printed wiring board including: a circuit board; multiple insulating layers provided on the circuit board; and a metal layer provided between the insulating layers, the insulating layers containing a cured product of the interlayer insulating material of the present invention.

Advantageous Effects of Invention

The present invention can provide a curable resin composition excellent in flexibility and processability before curing and excellent in adhesiveness, heat resistance, and dielectric characteristics after curing. The present invention can provide an adhesive, an adhesive film, a circuit board, an interlayer insulating material, and a printed wiring board each produced using the curable resin composition.

DESCRIPTION OF EMBODIMENTS

The present invention is described in detail in the following with reference to, but not limited to, examples.

Synthesis Example 1 (Production of Imide Oligomer Composition A)

An amount of 104 parts by weight of 4,4'-(4,4'-isopropylidenediphenoxy)diphthalic anhydride (available from Tokyo Chemical Industry Co., Ltd.) as an aromatic tetracarboxylic acid was dissolved in 300 parts by weight of N-methylpyrrolidone (available from FUJIFILM Wako Pure Chemical Corporation, "NMP"). To the obtained solution was added a solution obtained by diluting 56.8 parts by weight of Priamine 1073 (available from Croda International plc), which is a dimer diamine, in 100 parts by weight of N-methylpyrrolidone. The mixture was reacted by stirring at 25° C. for two hours to give an amic acid oligomer solution. The N-methylpyrrolidone was removed from the obtained amic acid oligomer solution by pressure reduction, followed by heating at 300° C. for two hours to give an imide oligomer composition A (imidization ratio 93%).

$^1$H-NMR, GPC, and FT-IR analyses showed that the imide oligomer composition A contained an aliphatic diamine residue-containing imide oligomer having a structure represented by the formula (3-1) or (3-3) (A is a 4,4'-(4,4'-isopropylidenediphenoxy)diphthalic acid residue and B is a dimer diamine residue). The imide oligomer composition A had a number average molecular weight of 2,200.

The imide oligomer composition A had a melting point of 47° C. as measured as an endothermic peak temperature during heating at 10° C./min using a differential scanning calorimeter (available from SII NanoTechnology Inc., "EXTEAR DSC6100").

Synthesis Example 2 (Production of Imide Oligomer Composition B)

An imide oligomer composition B (imidization ratio 95%) was obtained as in Synthesis Example 1 except that instead of 56.8 parts by weight of Priamine 1073 (available from Croda International plc), 61.7 parts by weight of Priamine 1071 (available from Croda International plc), which is a mixture of a dimer diamine and a trimer triamine, was used and that the amount of the 4,4'-(4,4'-isopropylidenediphenoxy)diphthalic anhydride added was changed to 115 parts by weight.

¹H-NMR, GPC, and FT-IR analyses showed that the imide oligomer composition B contained an aliphatic diamine residue-containing imide oligomer having a structure represented by the formula (1-1) (A is a 4,4'-(4,4'-isopropylidenediphenoxy)diphthalic acid residue and B is a dimer diamine residue). The analyses further showed that the imide oligomer composition B contained an aliphatic triamine residue-containing imide oligomer having a structure represented by the formula (2-1) (A is a 4,4'-(4,4'-isopropylidenediphenoxy)diphthalic acid residue and B is a trimer triamine residue). The imide oligomer composition B had a number average molecular weight of 2,780.

The imide oligomer composition B had a melting point of 52° C. as measured as in Synthesis Example 1.

Synthesis Example 3 (Production of Imide Oligomer Composition C)

An imide oligomer composition C (imidization ratio 94%) was obtained as in Synthesis Example 1 except that instead of 56.8 parts by weight of Priamine 1073 (available from Croda International plc), 56.1 parts by weight of Priamine 1074 (available from Croda International plc), which is a hydrogenated dimer diamine, was used.

¹H-NMR, GPC, and FT-IR analyses showed that the imide oligomer composition C contained an aliphatic diamine residue-containing imide oligomer having a structure represented by the formula (3-1) or (3-3) (A is a 4,4'-(4,4'-isopropylidenediphenoxy)diphthalic acid residue and B is a hydrogenated dimer diamine residue). The imide oligomer composition C had a number average molecular weight of 2,530.

The imide oligomer composition C had a melting point of 45° C. as measured as in Synthesis Example 1.

Synthesis Example 4 (Production of Imide Oligomer Composition D)

An imide oligomer composition D (imidization ratio 93%) was obtained as in Synthesis Example 3 except that the amount of Priamine 1074 (available from Croda International plc) added was changed to 28.1 parts by weight, and that 14.6 parts by weight of 1,3-bis(4-aminophenoxy)benzene (available from Seika Corporation, "TPE-R") as an aromatic diamine was dissolved in 400 parts by weight of N-methylpyrrolidone along with Priamine 1074. The molar ratio of Priamine 1074 to 1,3-bis(4-aminophenoxy)benzene was as follows: Priamine 1074:1,3-bis(4-aminophenoxy)benzene=1:1.

¹H-NMR, GPC, and FT-IR analyses showed that the imide oligomer composition D contained an aliphatic diamine residue-containing imide oligomer having a structure represented by the formula (3-1) or (3-3) (A is a 4,4'-(4,4'-isopropylidenediphenoxy)diphthalic acid residue and B is a hydrogenated dimer diamine residue or a 1,3-bis(4-aminophenoxy)benzene residue, where at least one of the repeating structures is a hydrogenated dimer diamine residue)). The imide oligomer composition D had a number average molecular weight of 2,200.

The imide oligomer composition D had a melting point of 59° C. as measured as in Synthesis Example 1.

Synthesis Example 5 (Production of Imide Oligomer Composition E)

An imide oligomer composition E (imidization ratio 93%) was obtained as in Synthesis Example 4 except that the amount of Priamine 1074 (available from Croda International plc) added was changed to 5.6 parts by weight, and that the amount of 1,3-bis(4-aminophenoxy)benzene added was changed to 26.3 parts by weight. The molar ratio of Priamine 1074 to 1,3-bis(4-aminophenoxy)benzene was as follows: Priamine 1074:1,3-bis(4-aminophenoxy)benzene=1:9.

¹H-NMR, GPC, and FT-IR analyses showed that the imide oligomer composition E contained an aliphatic diamine residue-containing imide oligomer having a structure represented by the formula (3-1) or (3-3) (A is a 4,4'-(4,4'-isopropylidenediphenoxy)diphthalic acid residue and B is a hydrogenated dimer diamine residue or a 1,3-bis(4-aminophenoxy)benzene residue, where at least one of Bs of the repeating structures is a hydrogenated dimer diamine residue). The imide oligomer composition E had a number average molecular weight of 2,100.

The imide oligomer composition E had a melting point of 70° C. as measured as in Synthesis Example 1.

Synthesis Example 6 (Production of Imide Oligomer Composition F)

An imide oligomer composition F (imidization ratio 95%) was obtained as in Synthesis Example 4 except that the amount of Priamine 1074 (available from Croda International plc) added was changed to 2.8 parts by weight, and that the amount of 1,3-bis(4-aminophenoxy)benzene added was changed to 27.8 parts by weight. The molar ratio of Priamine 1074 to 1,3-bis(4-aminophenoxy)benzene was as follows: Priamine 1074:1,3-bis(4-aminophenoxy)benzene=5:95.

¹H-NMR, GPC, and FT-IR analyses showed that the imide oligomer composition F contained an aliphatic diamine residue-containing imide oligomer having a structure represented by the formula (3-1) or (3-3) (A is a 4,4'-(4,4'-isopropylidenediphenoxy)diphthalic acid residue and B is a hydrogenated dimer diamine residue or a 1,3-bis(4-aminophenoxy)benzene residue, where at least one of Bs of the repeating structures is a hydrogenated dimer diamine residue). The imide oligomer composition F had a number average molecular weight of 1,980.

The imide oligomer composition F had a melting point of 92° C. as measured as in Synthesis Example 1.

Synthesis Example 7 (Production of Imide Oligomer Composition G)

An imide oligomer composition G (imidization ratio 93%) was obtained as in Synthesis Example 1 except that instead of 56.8 parts by weight of Priamine 1073 (available from Croda International plc), 14.5 parts by weight of 3,3'-diamino-N-methyldipropylamine (available from Tokyo Chemical Industry Co., Ltd.) was used.

¹H-NMR, GPC, and FT-IR analyses showed that the imide oligomer composition G contained an aliphatic triamine residue-containing imide oligomer having a structure represented by the formula (3-1) or (3-3) (A is a 4,4'-(4,4'-isopropylidenediphenoxy)diphthalic acid residue and B is a 3,3'-diamino-N-methyldipropylamine residue). The imide oligomer composition G had a number average molecular weight of 1,860.

The imide oligomer composition G had a melting point of 89° C. as measured as in Synthesis Example 1.

Synthesis Example 8 (Production of Imide Oligomer Composition H)

An imide oligomer composition H (imidization ratio 94%) was obtained as in Synthesis Example 1 except that instead of 56.8 parts by weight of Priamine 1073 (available from Croda International plc), 14.8 parts by weight of 1,2-bis(2-aminoethoxy)ethane (available from Tokyo Chemical Industry Co., Ltd.) was used.

$^1$H-NMR, GPC, and FT-IR analyses showed that the imide oligomer composition H contained an aliphatic diamine residue-containing imide oligomer having a structure represented by the formula (3-1) or (3-3) (A is a 4,4'-(4,4'-isopropylidenediphenoxy)diphthalic acid residue and B is a 1,2-bis(2-aminoethoxy)ethane residue). The imide oligomer composition H had a number average molecular weight of 1,910.

The imide oligomer composition H had a melting point of 84° C. as measured as in Synthesis Example 1.

Synthesis Example 9 (Production of Imide Oligomer Composition I)

An imide oligomer composition I (imidization ratio 95%) was obtained as in Synthesis Example 1 except that instead of 56.8 parts by weight of Priamine 1073 (available from Croda International plc), 14.2 parts by weight of 1,3-bis(aminomethyl)cyclohexane (available from Tokyo Chemical Industry Co., Ltd.) was used.

$^1$H-NMR, GPC, and FT-IR analyses showed that the imide oligomer composition I contained an aliphatic diamine residue-containing imide oligomer having a structure represented by the formula (3-1) or (3-3) (A is a 4,4'-(4,4'-isopropylidenediphenoxy)diphthalic acid residue and B is a 1,3-bis(aminomethyl)cyclohexane residue). The imide oligomer composition I had a number average molecular weight of 1,960.

The imide oligomer composition I had a melting point of 117° C. as measured as in Synthesis Example 1.

Synthesis Example 10 (Production of Imide Oligomer Composition J)

An imide oligomer composition J (imidization ratio 94%) was obtained as in Synthesis Example 3 except that instead of 104 parts by weight of 4,4'-(4,4'-isopropylidenediphenoxy)diphthalic anhydride, 62.0 parts by weight of 3,4'-oxydiphthalic dianhydride (available from Tokyo Chemical Industry Co., Ltd., "3,4'-ODPA") was used as an aromatic tetracarboxylic acid.

$^1$H-NMR, GPC, and FT-IR analyses showed that the imide oligomer composition J contained an aliphatic diamine residue-containing imide oligomer having a structure represented by the formula (3-1) or (3-3) (A is a 3,4'-oxydiphthalic acid residue and B is a hydrogenated dimer diamine residue). The imide oligomer composition J had a number average molecular weight of 2,040.

The imide oligomer composition J had a melting point of 68° C. as measured as in Synthesis Example 1.

Synthesis Example 11 (Production of Imide Oligomer Composition K)

An amount of 21.8 parts by weight of 3-aminophenol (available from Tokyo Chemical Industry Co., Ltd.) was dissolved in 400 parts by weight of N-methylpyrrolidone (available from FUJIFILM Wako Pure Chemical Corporation, "NMP"). To the obtained solution was added 157.3 parts by weight of the imide oligomer composition A obtained in Synthesis Example 1. The mixture was reacted by stirring at 25° C. for two hours to give an amic acid oligomer solution. The N-methylpyrrolidone was removed from the obtained amic acid oligomer solution by pressure reduction, followed by heating at 300° C. for two hours to give an imide oligomer composition K (imidization ratio 95%).

$^1$H-NMR, GPC, and FT-IR analyses showed that the imide oligomer composition K contained an aliphatic diamine residue-containing imide oligomer having, at an end, a structure represented by the formula (1-2) (A is a 4,4'-(4,4'-isopropylidenediphenoxy)diphthalic anhydride residue, B is a dimer diamine residue, and Ar is a group represented by the following formula (9)). The imide oligomer composition K had a number average molecular weight of 2,830.

The imide oligomer composition K had a melting point of 76° C. as measured as in Synthesis Example 1.

[Chem. 9]

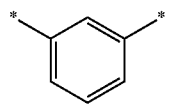

(9)

Synthesis Example 12 (Production of Imide Oligomer Composition L)

An imide oligomer composition L (imidization ratio 92%) was obtained as in Synthesis Example 1 except that the amount of 4,4'-(4,4'-isopropylidenediphenoxy)diphthalic anhydride added was changed to 78 parts by weight.

$^1$H-NMR, GPC, and FT-IR analyses showed that the imide oligomer composition L contained an aliphatic diamine residue-containing imide oligomer having a structure represented by the formula (3-1) or (3-3) (A is a 4,4'-(4,4'-isopropylidenediphenoxy)diphthalic acid residue and B is a dimer diamine residue). The imide oligomer composition L had a number average molecular weight of 5,500.

The imide oligomer composition L had a melting point of 58° C. as measured as in Synthesis Example 1.

Synthesis Example 13 (Production of Imide Oligomer Composition M)

An amount of 29.2 parts by weight of 1,3-bis(3-aminophenoxy)benzene (available from Mitsui Fine Chemicals, Inc., "APB-N"), which is an aromatic diamine, was dissolved in 400 parts by weight of N-methylpyrrolidone (available from FUJIFILM Wako Pure Chemical Corporation, "NMP"). To the obtained solution was added 104 parts by weight of 4,4'-(4,4'-isopropylidenediphenoxy)diphthalic anhydride (available from Tokyo Chemical Industry Co., Ltd.) as an aromatic tetracarboxylic acid. The mixture was reacted by stirring at 25° C. for two hours to give an amic acid oligomer solution. The N-methylpyrrolidone was removed from the obtained amic acid oligomer solution by pressure reduction, followed by heating at 300° C. for two hours to give an imide oligomer composition M (imidization ratio 94%).

$^1$H-NMR, GPC, and FT-IR analyses showed that the imide oligomer composition M did not contain an aliphatic diamine residue-containing imide oligomer, and contained an aromatic diamine residue-containing imide oligomer. The analyses showed that the aromatic diamine residue-containing imide oligomer had a structure in which the moiety corresponding to A in the formula (3-1) or (3-3) was a 4,4'-(4,4'-isopropylidenediphenoxy)diphthalic acid residue and the moiety corresponding to B was a 1,3-bis(3-aminophenoxy)benzene residue. The imide oligomer composition M had a number average molecular weight of 2,150.

The imide oligomer composition M had a melting point of 122° C. as measured as in Synthesis Example 1.

Synthesis Example 14 (Production of Imide Oligomer Composition N)

An imide oligomer composition N (imidization ratio 93%) was obtained as in Synthesis Example 13 except that instead of 29.2 parts by weight of 1,3-bis(3-aminophenoxy)benzene, which is an aromatic diamine, 29.2 parts by weight of 1,3-bis(4-aminophenoxy)benzene (available from Seika Corporation, "TPE-R"), which is an aromatic diamine, was used.

$^1$H-NMR, GPC, and FT-IR analyses showed that the imide oligomer composition N did not contain an aliphatic diamine residue-containing imide oligomer, and contained an aromatic diamine residue-containing imide oligomer. The analyses showed that the aromatic diamine residue-containing imide oligomer had a structure in which the moiety corresponding to A in the formula (3-1) or (3-3) was a 4,4'-(4,4'-isopropylidenediphenoxy)diphthalic acid residue and the moiety corresponding to B was a 1,3-bis(4-aminophenoxy)benzene residue. The imide oligomer composition N had a number average molecular weight of 2,010.

The imide oligomer composition N had a melting point of 125° C. as measured as in Synthesis Example 1.

Synthesis Example 15 (Production of Imide Oligomer Composition O)

An amount of 21.8 parts by weight of 3-aminophenol (available from Tokyo Chemical Industry Co., Ltd.) was dissolved in 400 parts by weight of N-methylpyrrolidone (available from FUJIFILM Wako Pure Chemical Corporation, "NMP"). To the obtained solution was added 143.2 parts by weight of the imide oligomer composition D obtained in Synthesis Example 4. The mixture was reacted by stirring at 25° C. for two hours to give an amic acid oligomer solution. The N-methylpyrrolidone was removed from the obtained amic acid oligomer solution by pressure reduction, followed by heating at 300° C. for two hours to give an imide oligomer composition O (imidization ratio 93%).

$^1$H-NMR, GPC, and FT-IR analyses showed that the imide oligomer composition O contained an aliphatic diamine residue-containing imide oligomer having, at an end, a structure represented by the formula (1-2) (A is a 4,4'-(4,4'-isopropylidenediphenoxy)diphthalic acid residue, B is a hydrogenated dimer diamine residue or a 1,3-bis(4-aminophenoxy)benzene residue, and Ar is a group represented by the formula (9)). The imide oligomer composition O had a number average molecular weight of 2,720.

The imide oligomer composition O had a melting point of 90° C. as measured as in Synthesis Example 1.

Synthesis Example 16 (Production of Imide Oligomer Composition P)

An amount of 175.5 parts by weight of the imide oligomer composition K obtained in Synthesis Example 11 and 20.3 parts by weight of triethylamine were dissolved in 400 parts by weight of tetrahydrofuran (super dehydrated) (available from FUJIFILM Wako Pure Chemical Corporation, "THF"). To the obtained solution was added 28.1 parts by weight of benzoylchloride (available from Tokyo Chemical Industry Co., Ltd.), followed by stirring for four hours at 25° C. to allow esterification to proceed. Thereafter, the THF was removed by pressure reduction to give an imide oligomer composition P (imidization ratio 95%).

$^1$H-NMR, GPC, and FT-IR analyses showed that the imide oligomer composition P contained an aliphatic diamine residue-containing imide oligomer having a structure represented by the formula (1-3) at an end. In the aliphatic diamine residue-containing imide oligomer, in the formula (1-3), $R^1$ was a phenyl group, $R^2$ was a group represented by the formula (9), A was a 4,4'-(4,4'-isopropylidenediphenoxy)diphthalic acid residue, and B was a dimer diamine residue. The imide oligomer composition P had a number average molecular weight of 3,150.

The imide oligomer composition P had a melting point of 91° C. as measured as in Synthesis Example 1.

Synthesis Example 17 (Production of Imide Oligomer Composition Q)

An imide oligomer composition Q (imidization ratio 93%) was obtained as in Synthesis Example 16 except that instead of 175.5 parts by weight of the imide oligomer composition K, 161.3 parts by weight of the imide oligomer composition O obtained in Synthesis Example 15 was used.

$^1$H-NMR, GPC, and FT-IR analyses showed that the imide oligomer composition Q contained an aliphatic diamine residue-containing imide oligomer having a structure represented by the formula (1-3) at an end. In the aliphatic diamine residue-containing imide oligomer, in the formula (1-3), $R^1$ was a phenyl group, $R^2$ was a group represented by the formula (9), A was a 4,4'-(4,4'-isopropylidenediphenoxy)diphthalic anhydride residue, and B was a hydrogenated dimer diamine residue or a 1,3-bis(4-aminophenoxy)benzene residue. The imide oligomer composition Q had a number average molecular weight of 3,000.

The imide oligomer composition Q had a melting point of 103° C. as measured as in Synthesis Example 1.

Synthesis Example 18 (Production of Imide Oligomer Composition R)

An amount of 21.8 parts by weight of 3-aminophenol (available from Tokyo Chemical Industry Co., Ltd.) was dissolved in 400 parts by weight of N-methylpyrrolidone (available from FUJIFILM Wako Pure Chemical Corporation, "NMP"). To the obtained solution was added 129.7 parts by weight of the imide oligomer composition M obtained in Synthesis Example 13. The mixture was reacted by stirring at 25° C. for two hours to give an amic acid oligomer solution. The N-methylpyrrolidone was removed from the obtained amic acid oligomer solution by pressure reduction, followed by heating at 300° C. for two hours to give an imide oligomer composition R (imidization ratio 94%).

$^1$H-NMR, GPC, and FT-IR analyses showed that the imide oligomer composition R did not contain an aliphatic diamine residue-containing imide oligomer and contained an aromatic diamine residue-containing imide oligomer. In the aromatic diamine residue-containing imide oligomer, the moiety corresponding to A in the formula (1-2) was a 4,4'-(4,4'-isopropylidenediphenoxy)diphthalic acid residue, the moiety corresponding to B was a 1,3-bis(3-aminophenoxy)benzene residue, and Ar was a group represented by the formula (9). The imide oligomer composition R had a number average molecular weight of 2,600.

The imide oligomer composition R had a melting point of 140° C. as measured as in Synthesis Example 1.

Synthesis Example 19 (Production of Imide Oligomer Composition S)

An amount of 147.9 parts by weight of the imide oligomer composition R obtained in Synthesis Example 18 and 20.3 parts by weight of triethylamine were dissolved in 400 parts by weight of tetrahydrofuran (super dehydrated) (available from FUJIFILM Wako Pure Chemical Corporation, "THF"). To the obtained solution was added 28.1 parts by weight of benzoylchloride (available from Tokyo Chemical Industry Co., Ltd.), followed by stirring at 25° C. for four hours to allow esterification to proceed. Thereafter, the N-methylpyrrolidone was removed by pressure reduction to give an imide oligomer composition S (imidization ratio 94%).

$^1$H-NMR, GPC, and FT-IR analyses showed that the imide oligomer composition S did not contain an aliphatic diamine residue-containing imide oligomer and contained an aromatic diamine residue-containing imide oligomer. In the aromatic diamine residue-containing imide oligomer, the moiety corresponding to $R^1$ in the formula (1-3) was a phenyl group, the moiety corresponding to $R^2$ was a group represented by the formula (9), the moiety corresponding to A was a 4,4'-(4,4'-isopropylidenediphenoxy)diphthalic anhydride residue, and the moiety corresponding to B was a 1,3-bis(3-aminophenoxy)benzene residue. The imide oligomer composition S had a number average molecular weight of 2,920.

The imide oligomer composition S had a melting point of 155° C. as measured as in Synthesis Example 1.

(Adhesive Film)

Examples 1 to 16 and Comparative Examples 1 to 5

Curable resin compositions of Examples 1 to 16 and Comparative Examples 1 to 5 were produced in accordance with the formulations shown in Tables 1 to 4.

Each of the obtained curable resin compositions was applied to a substrate PET film to a thickness of about 20 μm and dried to prepare a curable resin composition film.

Evaluation

The curable resin compositions and curable resin composition films obtained in Examples 1 to 16 and Comparative Examples 1 to 5 were evaluated as follows. Tables 1 to 4 show the results.

(Glass Transition Temperature Before Curing)

The substrate PET film was removed from each of the curable resin composition films obtained in Examples 1 to 16 and Comparative Examples 1 to 5. Pieces of the curable resin composition film were laminated using a laminator to prepare a curable resin composition film having a thickness of 400 μm. The glass transition temperature of the curable resin composition film was determined as a peak temperature from a tan δ curve obtained during heating from 0° C. to 300° C. using a dynamic viscoelastometer (available from A & D Company, Limited, "RHEOVIBRON DDV-25GP") at a rate of temperature rise of 10° C./min, a frequency of 10 Hz, and a chuck distance of 24 mm.

(Flexibility)

Each of the curable resin composition films obtained in Examples 1 to 16 and Comparative Examples 1 to 5 was subjected to a 5-mm-diameter winding test, in which the film was wound around a cylinder having a diameter of 5 mm at 25° C. and examined for the presence or absence of a fracture or chip in the curable resin composition film. Each adhesive film was also subjected to a 180-degree bending test, in which the adhesive film was bent 180 degrees and examined for the presence or absence of a fracture or chip in the curable resin composition film.

The flexibility was evaluated as "0 (Good)" when no fracture or chip was present in both the 5-mm-diameter winding test and the 180-degree bending test, "r (Fair)" when no fracture or chip was present in the 5-mm-diameter winding test but a fracture or chip was present in the 180-degree bending test, and "x (Poor)" when a fracture or chip was present in both tests.

(Processability)

Each of the curable resin composition films obtained in Examples 1 to 16 and Comparative Examples 1 to 5 was subjected to punching processing at 25° C. using a Thomson blade. The state of the fracture cross section and whether dust had fallen off were examined.

The processability was evaluated as "○ (Good)" when the fracture cross section was smooth and no dust had fallen off, "Δ (Fair)" when no dust had fallen off but the fracture cross section was not smooth, and "x (Poor)" when the fracture cross section was not smooth and dust had fallen off.

(Glass Transition Temperature of Cured Product)

The substrate PET film was removed from each of the curable resin composition films obtained in Examples 1 to 16 and Comparative Examples 1 to 5. Pieces of the curable resin composition film were laminated using a laminator and heated at 190° C. for one hour to prepare a cured product having a thickness of 400 μm. The glass transition temperature of the obtained cured product was determined as a peak temperature from a tan δ curve obtained during heating from 0° C. to 300° C. using a dynamic viscoelastometer (available from A & D Company, Limited, "RHEOVIBRON DDV-25GP") at a rate of temperature rise of 10° C./min, a frequency of 10 Hz, and a chuck distance of 24 mm.

(Adhesiveness)

The substrate PET film was removed from each of the curable resin compositions obtained in Examples 1 to 16 and Comparative Examples 1 to 5. Polyimide films (available from Du Pont-Toray Co., Ltd., "Kapton 200H"), each having a thickness of 50 μm, were bonded to both surfaces of the adhesive layer using a laminator with heating at 70° C. The laminate was hot pressed under the conditions of 190° C., 3 MPa, and one hour to cure the adhesive layer, and then cut into a specimen having a width of 1 cm. The specimen within 24 hours after the preparation was subjected to a T-peeling using a tensile tester (available from Orientec Co., Ltd., "UCT-500") at 25° C. at a peeling speed of 20 mm/min to measure the peel strength. The obtained peel strength was taken as the initial adhesive force. Separately, a specimen prepared in the same manner was stored at 200° C. for 100 hours and then cooled to 25° C. The adhesive force of the specimen within 24 hours after the cooling was measured in the same manner as the initial adhesive force.

For adhesiveness evaluation, the initial adhesive force and the adhesive force after storage at 200° C. for 100 hours were separately evaluated as "○○ (Very Good)" when they were 6.0 N/cm or more, "○ (Good)" when they were 3.4 N/cm or more and less than 6.0 N/cm, and "x (Poor)" when they were less than 3.4 N/cm.

(Thermal Decomposition Resistance (5% Weight Reduction Temperature))

Each of the curable resin composition films obtained in Examples 1 to 16 and Comparative Examples 1 to 5 was cured by heating at 190° C. for one hour to prepare a cured product.

The 5% weight reduction temperature of the obtained cured product was measured using a thermogravimetric analyzer (available from Hitachi High-Tech Science Corporation, "TG/DTA6200") in a temperature range of 30° C. to 500° C. under the heating conditions of 10° C./min.

(Long-Term Heat Resistance)

Polyimide films (available from Du Pont-Toray Co., Ltd., "Kapton V"), each having a thickness of 20 μm, were stacked on both surfaces of each of the curable resin composition films obtained in Examples 1 to 16 and Comparative Examples 1 to 5. The curable resin composition film was cured by heating at 190° C. for one hour, followed by heat treatment at 175° C. for 1,000 hours. The laminate of the cured product of the curable resin composition film and the polyimide films after the heat treatment was placed in an arch shape along a cylinder having a diameter of 5 mm or 3 mm at room temperature. The state of the laminate of the curable resin composition film and the polyimide films was then visually observed.

The long-term heat resistance was evaluated as "○ (Good)" when no crack or fracture was observed at all in the laminate placed in an arch shape along the cylinder having a diameter of 3 mm, "Δ (Fair)" when no crack or fracture was observed in the laminate placed in an arch shape along the cylinder having a diameter of 5 mm, but a crack or a fracture was observed in the laminate placed in an arch shape along the cylinder having a diameter of 3 mm, and "x (Poor)" when a crack or fracture was observed in the laminate placed in an arch shape along the cylinder having a diameter of 5 mm.

TABLE 1

| | | | Example | | | | | | |
| --- | --- | --- | --- | --- | --- | --- | --- | --- | --- |
| | | | 1 | 2 | 3 | 4 | 5 | 6 | 7 |
| Composition (parts by weight) | Curable resin | Bisphenol F epoxy resin (available from DIC Corporation, "EPICLON EXA-830CRP") | 100 | 100 | 100 | 100 | 100 | 100 | 100 |
| | Curing agent | Imide oligomer composition A | 197 | — | — | — | — | — | — |
| | | Imide oligomer composition B | — | 216 | — | — | — | — | — |
| | | Imide oligomer composition C | — | — | 196 | — | — | — | — |
| | | Imide oligomer composition D | — | — | — | 179 | — | — | — |
| | | Imide oligomer composition E | — | — | — | — | 166 | — | — |
| | | Imide oligomer composition F | — | — | — | — | — | 164 | — |
| | | Imide oligomer composition G | — | — | — | — | — | — | 144 |
| | Curing accelerator | 2,4-diamino-6-(2'-methylimidazolyl-(1'))-ethyl-s-triazine (available from Shikoku Chemicals Corporation, "2MZ-A", melting point 248° C. to 258° C.) | 3 | 3 | 3 | 3 | 3 | 3 | 3 |
| | Fluidity control agent | Hydrophobic fumed silica (available from Tokuyama Corporation, "MT-10") | 30 | 30 | 30 | 30 | 30 | 30 | 30 |
| | Solvent | Methyl ethyl ketone (available from FUJIFILM Wako Pure Chemical Corporation, "MEK") | 300 | 300 | 300 | 300 | 300 | 300 | 300 |
| | Amount of imide oligomer in 100 parts by weight of total of curable resin and curing agent containing imide oligomer (parts by weight) | | 66 | 68 | 66 | 64 | 62 | 62 | 59 |
| Evaluation | Before curing (B stage) | Glass transition temperature before curing (° C.) | 5 | 9 | 6 | 9 | 17 | 23 | 24 |
| | | Flexibility | ○ | ○ | ○ | ○ | ○ | ○ | Δ |
| | | Processability | ○ | ○ | ○ | ○ | ○ | Δ | Δ |
| | After curing | Glass transition temperature of cured product | 128 | 136 | 122 | 177 | 217 | 169 | 204 |
| | | Adhesiveness — Initial adhesive force | ○○ | ○○ | ○○ | ○○ | ○○ | ○○ | ○○ |
| | | Adhesive force after storage at 200° C. for 100 hours | ○○ | ○○ | ○○ | ○○ | ○○ | ○ | ○○ |
| | | Thermal decomposition resistance (5% weight reduction temperature (° C.)) | 368 | 366 | 372 | 375 | 373 | 375 | 371 |
| | | Long-term heat resistance | ○ | ○ | ○ | ○ | ○ | ○ | ○ |

TABLE 2

| | | | Example | | | | | |
| --- | --- | --- | --- | --- | --- | --- | --- | --- |
| | | | 8 | 9 | 10 | 11 | 12 | 13 |
| Composition (parts by weight) | Curable resin | Bisphenol F epoxy resin (available from DIC Corporation, "EPICLON EXA-830CRP") | 100 | 100 | 100 | 100 | 100 | 100 |
| | Curing agent | Imide oligomer composition C | — | — | — | — | 20 | 5 |
| | | Imide oligomer composition H | 144 | — | — | — | — | — |
| | | Imide oligomer composition I | — | 143 | — | — | — | — |
| | | Imide oligomer composition J | — | — | 143 | — | — | — |
| | | Imide oligomer composition K | — | — | — | 439 | — | — |
| | | Imide oligomer composition N | — | — | — | — | 120 | 135 |
| | Curing accelerator | 2,4-diamino-6-(2'-methylimidazolyl-(1'))-ethyl-s-triazine (available from Shikoku Chemicals Corporation, "2MZ-A", melting point 248° C. to 258° C.) | 3 | 3 | 3 | 3 | 3 | 3 |
| | Fluidity control agent | Hydrophobic fumed silica (available from Tokuyama Corporation, "MT-10") | 30 | 30 | 30 | 30 | 30 | 30 |

TABLE 2-continued

|  |  |  | Example | | | | | |
|---|---|---|---|---|---|---|---|---|
|  |  |  | 8 | 9 | 10 | 11 | 12 | 13 |
|  | Solvent | Methyl ethyl ketone (available from FUJIFILM Wako Pure Chemical Corporation, "MEK") | 300 | 300 | 300 | 300 | 300 | 300 |
|  | Amount of imide oligomer in 100 parts by weight of total of curable resin and curing agent containing imide oligomer (parts by weight) | | 59 | 59 | 59 | 81 | 17 | 5 |
| Evaluation | Before curing (B stage) | Glass transition temperature before curing (° C.) | 22 | 21 | 10 | 12 | 16 | 24 |
|  |  | Flexibility | ○ | ○ | ○ | ○ | ○ | Δ |
|  |  | Processability | Δ | Δ | ○ | ○ | ○ | Δ |
|  | After curing | Glass transition temperature of cured product | 151 | 167 | 145 | 135 | 151 | 158 |
|  | Adhesiveness | Initial adhesive force | ○○ | ○○ | ○○ | ○ | ○○ | ○○ |
|  |  | Adhesive force after storage at 200° C. for 100 hours | ○○ | ○○ | ○○ | ○ | ○○ | ○○ |
|  |  | Thermal decomposition resistance (5% weight reduction temperature (° C.)) | 369 | 381 | 365 | 392 | 380 | 379 |
|  |  | Long-term heat resistance | ○ | ○ | ○ | ○ | ○ | ○ |

TABLE 3

|  |  |  | Example | | |
|---|---|---|---|---|---|
|  |  |  | 14 | 15 | 16 |
| Composition (parts by weight) | Curable resin | Bisphenol F epoxy resin (available from DIC Corporation, "EPICLON EXA-830CRP") | 100 | 100 | 100 |
|  | Curing agent | Imide oligomer composition O | 404 | — | — |
|  |  | Imide oligomer composition P | — | 491 | — |
|  |  | Imide oligomer composition Q | — | — | 456 |
|  | Curing accelerator | 2,4-diamino-6-(2'-methylimidazolyl-(1'))-ethyl-s-triazine (available from Shikoku Chemicals Corporation, "2MZ-A", melting point 248° C. to 258° C.) | 3 | 3 | 3 |
|  | Fluidity control agent | Hydrophobic fumed silica (available from Tokuyama Corporation, "MT-10") | 30 | 30 | 30 |
|  | Solvent | Methyl ethyl ketone (available from FUJIFILM Wako Pure Chemical Corporation, "MEK") | 300 | 300 | 300 |
|  | Amount of imide oligomer in 100 parts by weight of total of curable resin and curing agent containing imide oligomer (parts by weight) | | 80 | 83 | 82 |
| Evaluation | Before curing (B stage) | Glass transition temperature before curing (° C.) | 20 | 21 | 23 |
|  |  | Flexibility | ○ | ○ | ○ |
|  |  | Processability | ○ | ○ | ○ |
|  | After curing | Glass transition temperature of cured product | 180 | 138 | 185 |
|  | Adhesiveness | Initial adhesive force | ○ | ○ | ○ |
|  |  | Adhesive force after storage at 200° C. for 100 hours | ○ | ○ | ○ |
|  |  | Thermal decomposition resistance (5% weight reduction temperature (° C.)) | 402 | 382 | 390 |
|  |  | Long-term heat resistance | ○ | ○ | ○ |

TABLE 4

|  |  |  | Comparative Example | | | | |
|---|---|---|---|---|---|---|---|
|  |  |  | 1 | 2 | 3 | 4 | 5 |
| Composition (parts by weight) | Curable resin | Bisphenol F epoxy resin (available from DIC Corporation, "EPICLON EXA-830CRP") | 100 | 100 | 100 | 100 | 100 |
|  | Curing agent | Imide oligomer composition L | 197 | — | — | — | — |
|  |  | Imide oligomer composition M | — | 162 | — | — | — |
|  |  | Imide oligomer composition N | — | — | 162 | — | — |
|  |  | Imide oligomer composition R | — | — | — | 370 | — |
|  |  | Imide oligomer composition S | — | — | — | — | 422 |
|  | Curing accelerator | 2,4-diamino-6-(2'-methylimidazolyl-(1'))-ethyl-s-triazine (available from Shikoku Chemicals Corporation, "2MZ-A", melting point 248° C. to 258° C.) | 3 | 3 | 3 | 3 | 3 |
|  | Fluidity control agent | Hydrophobic fumed silica (available from Tokuyama Corporation, "MT-10") | 30 | 30 | 30 | 30 | 30 |
|  | Solvent | Methyl ethyl ketone (available from FUJIFILM Wako Pure Chemical Corporation, "MEK") | 300 | 300 | 300 | 300 | 300 |
|  | Amount of imide oligomer in 100 parts by weight of total of curable resin and curing agent containing imide oligomer (parts by weight) | | 66 | 62 | 62 | 79 | 81 |

TABLE 4-continued

| | | | Comparative Example | | | | |
|---|---|---|---|---|---|---|---|
| | | | 1 | 2 | 3 | 4 | 5 |
| Evaluation | Before curing (B stage) | Glass transition temperature before curing (° C.) | 12 | 26 | 27 | 30 | 35 |
| | | Flexibility | ○ | x | x | x | x |
| | | Processability | ○ | x | x | x | x |
| | After curing | Glass transition temperature of cured product | 125 | 161 | 166 | 167 | 170 |
| | | Adhesiveness  Initial adhesive force | x | ○○ | ○○ | ○ | ○ |
| | | Adhesive force after storage at 200° C. for 100 hours | x | ○○ | ○○ | ○ | ○ |
| | | Thermal decomposition resistance (5% weight reduction temperature (° C.)) | 365 | 375 | 377 | 390 | 385 |
| | | Long-term heat resistance | x | ○ | ○ | ○ | ○ |

(Interlayer Insulating Material)

Examples 17 to 26 and Comparative Examples 6 to 8

The materials in accordance with the formulations shown in Tables 5 and 6 were stirred at 1,200 rpm for four hours to prepare interlayer insulating materials (resin composition vanishes). The compositions in Table 5 and 6 do not include solvents, and show solid components.

Each of the obtained interlayer insulating materials was applied to the release-treated side of a PET film (available from Toray Industries Inc., "XG284", thickness: 25 μm) using an applicator. The solvent was evaporated by drying in a gear oven at 100° C. for 2.5 minutes, giving an uncured laminated film including the PET film and a resin film (B-stage film) on the PET film. The resin film had a thickness of 40 μm and a residual solvent content of 1.0% by weight or more and 3.0% by weight or less.

Evaluation

The uncured laminated films obtained in Examples 17 to 26 and Comparative Examples 6 to 8 were evaluated as follows. Tables 5 and 6 show the results.
(Flexibility)

Each of the uncured laminated films obtained in Examples 17 to 26 and Comparative Example 6 to 8 was cut into a rectangular shape with a length of 10 cm×and a width of 5 cm. This film was bent 90 degrees or 180 degrees and bent back to its flat form. The state of the film was visually observed. Here, the film is more likely to fracture when bent 180 degrees than when bent 90 degrees.

The flexibility was evaluated as "○ (Good)" when the film did not fracture either when bent 90 degrees or when bent 180 degrees, "Δ (Fair)" when the film fractured when bent 180 degrees but did not when bent 90 degrees, and "x (Poor)" when the film fracture both when bent 90 degrees and when bent 180 degrees.
(Dielectric Characteristics)

Each of the uncured laminated films obtained in Examples 17 to 26 and Comparative Example 6 to 8 was cut to pieces having a width of 2 mm and a length of 80 mm. Five pieces were stacked together to prepare a stack having a thickness of 200 μm. The obtained stack was heated at 190° C. for 90 minutes to prepare a cured article. The dielectric loss tangent of the cured article was measured by the cavity resonance method at 23° C. and a frequency of 1.0 GHz using a cavity resonance perturbation method dielectric constant measuring device CP521 (available from Kanto Electronic Application and Development Inc.) and a network analyzer N5224A PNA (available from available from Keysight Technologies).

The dielectric characteristics were evaluated as "○○ (Very Good)" when the dielectric loss tangent was 0.0035 or less, "○ (Good)" when the dielectric loss tangent was more than 0.0035 and 0.0040 or less, "Δ (Fair)" when the dielectric loss tangent was more than 0.0040 and 0.0045 or less, and "x (Poor)" when the dielectric loss tangent was more than 0.0045.
(Desmear Performance (Residue Removability at Via Bottom))
(1) Lamination and Semi-Curing Treatment Both surfaces of a CCL substrate (available from Hitachi Chemical Co., Ltd., "E679FG") were immersed in a copper surface roughening agent (available from MEC Co., Ltd., "MECetchBOND CZ-8100") to roughen the copper surfaces. Each of the uncured laminated films obtained in Examples 17 to 26 and Comparative Example 6 to 8 was laminated on both surfaces of the CCL substrate from the resin film side using a diaphragm type vacuum laminator (available from Meiki Co., Ltd., "MVLP-500"). Thus, an uncured laminated sample A was obtained. The lamination was performed by setting the atmospheric pressure to 13 hPa or less by reducing the pressure for 20 seconds, and then pressing the workpiece at 100° C. at a pressure of 0.8 MPa for 20 seconds.

The PET films were removed from the resin films of the obtained uncured laminated sample A. The resin films were cured at the curing conditions of 170° C. and 30 minutes to give a semi-cured laminated sample.
(2) Formation of Via (Through Hole)

A via (through hole) having a diameter of 60 μm at the upper end and a diameter of 40 μm at the lower end (bottom) was formed in the obtained semi-cured laminated sample using a CO₂ laser (available from Hitachi Via Mechanics, Ltd.). Thus, a laminate B was obtained, in which the semi-cured products of the resin films were laminated on the CCL substrate and a via (through hole) was formed in the semi-cured products of the resin films.
(3) Residue Removal Treatment at Via Bottom
(a) Swelling Treatment The obtained laminate B was placed in a sweller (available from Atotech Japan K.K., "Swelling Dip Securiganth P") at 70° C. and oscillated for 10 minutes. The laminate B was then washed with pure water.
(b) Permanganate Treatment (Roughening Treatment and Desmear Treatment)

The laminate B after the swelling treatment was put in a potassium permanganate (available from Atotech Japan K.K., "Concentrate Compact CP") roughening aqueous solution at 80° C. and oscillated for 30 minutes. Next, the laminate was treated in a cleaning solution (available from Atotech Japan K.K., "Reduction Securiganth P") at 25° C. for two minutes, and then washed with pure water to give an evaluation sample 1.

The via bottom in the evaluation sample 1 was observed with a scanning electron microscope (SEM) and the maximum smear length from the wall surface at the via bottom was measured.

The desmear performance (residue removability at via bottom) was evaluated as "∘∘ (Very Good)" when the maximum smear length was shorter than 2 µm, "∘ (Good)" when the maximum smear length was 2 µm or longer and shorter than 2.5 µm, "Δ (Fair)" when the maximum smear length was 2.5 µm or longer and shorter than 3 µm, and "x (Poor)" when the maximum smear length was 3 µm or longer.

(Plating Adhesiveness)

A semi-cured laminated sample prepared in the same manner as in "(Desmear performance (residue removability at via bottom))" was put in a sweller (aqueous solution prepared from "Swelling Dip Securiganth P" available from Atotech Japan K.K. and sodium hydroxide (available from FUJIFILM Wako Pure Chemical Corporation)) at 70° C. The sample was oscillated for 10 minutes and then washed with pure water.

The semi-cured sample after the swelling treatment was put in a sodium permanganate roughening aqueous solution (aqueous solution prepared from "Concentrate Compact CP" available from Atotech Japan K.K. and sodium hydroxide (available from FUJIFILM Wako Pure Chemical Corporation)) at 80° C. and oscillated for 30 minutes. Subsequently, the sample was washed with a cleaning solution (aqueous solution prepared from "Reduction Securiganth P" available from Atotech Japan K.K. and sulfuric acid (available from FUJIFILM Wako Pure Chemical Corporation)) at 25° C. for two minutes, then further washed with pure water, whereby a roughened cured product was formed on the CCL substrate.

The surface of the roughened cured product was treated with an alkali cleaner ("Cleaner Securiganth 902" available from Atotech Japan K.K.) at 60° C. for five minutes for degreasing and washing. After the washing, the cured product was treated with a pre-dip solution (available from Atotech Japan K.K., "Pre Dip Neoganth B") at 25° C. for two minutes. Thereafter, the cured product was treated with an activator solution (available from Atotech Japan K.K., "Activator Neoganth 834") at 40° C. for five minutes, whereby a palladium catalyst was attached.

Subsequently, the cured product was treated with a reducing solution (available from Atotech Japan K.K., "Reducer Neoganth WA") at 30° C. for five minutes and then put in chemical copper solutions ("Basic Printganth MSK-DK", "Copper Printganth MSK", "Stabilizer Printganth MSK", and "Reducer Cu", all available from Atotech Japan K.K.). Electroless plating was performed until the plating thickness reached about 0.5 µm. After the electroless plating, annealing was performed at 120° C. for 30 minutes to remove the remaining hydrogen gas. All the steps to the electroless plating step were performed while the cured product was oscillated, with the amount of each treatment solution being 2 L on a beaker scale.

Electroplating was performed on the cured product after the electroless plating. The electroplating was performed using a copper sulfate solution (aqueous solution prepared from copper sulfate pentahydrate (available from FUJIFILM Wako Pure Chemical Corporation), sulfuric acid (available from FUJIFILM Wako Pure Chemical Corporation), "Basic Leveler Cupracid HL", and "Correction Solution Cupracid GS" available from Atotech Japan K.K.), at a current of 0.6 A/cm$^2$ until the plating thickness reached about 25 µm. After the electroplating, the cured product was heated at 190° C. for 90 minutes to be further cured, whereby a cured product having a copper plating layer on its upper surface was obtained.

In the obtained cured product having the copper plating layer laminated thereon, a cut having a width of 10 mm was made in the surface of the copper plating layer. The adhesion strength (90° peel strength) between the cured product (insulating layer) and the metal layer (copper plating layer) was then measured using a tensile tester (available from Shimadzu Corporation, "AG-5000B") at a crosshead speed of 5 mm/min.

The plating adhesiveness was evaluated as "∘∘ (Very Good)" when the peel strength was 0.50 kgf/cm or more, "∘ (Good)" when the peel strength was 0.45 kgf/cm or more and less than 0.50 kgf/cm, "Δ (Fair)" when the peel strength was 0.40 kgf/cm or more and less than 0.45 kgf/cm, "x (Poor)" when the peel strength was less than 0.40 kgf/cm.

TABLE 5

|  |  |  | Example | | | | | | | | Comparative Example | |
|---|---|---|---|---|---|---|---|---|---|---|---|---|
|  |  |  | 17 | 18 | 19 | 20 | 21 | 22 | 23 | 24 | 6 | 7 |
| Composition (parts by weight) | Curable resin | Biphenyl epoxy resin (available from Nippon Kayaku Co.,Ltd., "NC-3000") | 7.8 | 7.8 | 7.8 | 7.8 | 7.8 | 7.8 | 7.8 | 7.8 | 7.8 | 7.8 |
|  |  | Naphthalene epoxy resin (available from DIC Corporation, "HP-4032D") | 1.3 | 1.3 | 12 | 1.3 | 1.3 | 1.3 | 1.3 | 1.3 | 1.3 | 1.3 |
|  |  | Bisphenol F epoxy resin (available from DIC Corporation, "EPICLON EXA-830CRP") | 1.5 | 1.5 | 1.5 | 1.5 | 1.5 | 1.5 | 1.5 | 1.5 | 1.5 | 1.5 |
|  |  | Naphthalene epoxy resin (available from Nippon Steel & Sumikin Chemical Co., Ltd., "ESN-475V") | 3.0 | 3.0 | 3.0 | 3.0 | 3.0 | 3.0 | 3.0 | 3.0 | 3.0 | 3.0 |
|  | Curing agent | Active ester curing agent (available from DIC Corporation, "EPICLON EXB-9416-70BK") | 2.5 | 6.2 | 8.7 | 8.7 | 8.7 | 8.7 | 8.7 | 2.5 | 12.5 | 8.7 |

TABLE 5-continued

|  |  |  | Example |  |  |  |  |  |  |  | Comparative Example |  |
|---|---|---|---|---|---|---|---|---|---|---|---|---|
|  |  |  | 17 | 18 | 19 | 20 | 21 | 22 | 23 | 24 | 6 | 7 |
|  |  | Phenol curing agent (available from Meiwa Plastic Industries, Ltd., "MEH7851-4H") | 2.3 | 2.3 | 2.3 | 2.3 | 2.3 | 2.3 | 2.3 | 2.3 | 2.3 | 2.3 |
|  |  | Imide oligomer composition C | 10.0 | 6.3 | 3.8 | — | — | — | — | — | — | — |
|  |  | Imide oligomer composition D | — | — | — | 3.8 | — | — | — | — | — | — |
|  |  | Imide oligomer composition E | — | — | — | — | 3.8 | — | — | — | — | — |
|  |  | Imide oligomer composition F | — | — | — | — | — | 3.8 | — | — | — | — |
|  |  | Imide oligomer composition H | — | — | — | — | — | — | 3.8 | — | — | — |
|  |  | Imide oligomer composition J | — | — | — | — | — | — | — | 10.0 | — | — |
|  |  | Imide oligomer composition N | — | — | — | — | — | — | — | — | — | 3.8 |
| Thermoplastic resin | Phenoxy resin (available from Mitsubishi Chemical Corporation, "YX6954BH30") |  | 1.0 | 1.0 | 1.0 | 1.0 | 1.0 | 1.0 | 1.0 | 1.0 | 1.0 | 1.0 |
| Curing accelerator | 2-phenyl-benzyl-1H-imidazole (available from Shikoku Chemicals Corporation, "1B2PZ", melting point 40° C.) |  | 0.6 | 0.6 | 0.6 | 0.6 | 0.6 | 0.6 | 0.6 | 0.6 | 0.6 | 0.6 |
| Inorganic filler | Silica (available from Admatechs Company Limited, "SC4050-HOA") |  | 70.0 | 70.0 | 70.0 | 70.0 | 70.0 | 70.0 | 70.0 | 70.0 | 70.0 | 70.0 |
| Amount of imide oligomer in 100 parts by weight of total of curable resin and curing agent containing imide oligomer (parts by weight) |  |  | 35 | 22 | 13 | 13 | 13 | 13 | 13 | 35 | 0 | 13 |
| Evaluation | Before curing (B stage) | Flexibility | ○ | ○ | ○ | ○ | ○ | Δ | Δ | ○ | x | x |
|  | After curing | Dielectric characteristics (dielectric loss tangent) | Δ | ○ | ○ | ○ | ○ | Δ | Δ | ○ | ○ | x |
|  |  | Desmear performance | ○○ | ○○ | ○ | ○ | ○ | Δ | Δ | ○○ | x | x |
|  |  | Plating adhesiveness | ○○ | ○○ | ○○ | ○○ | ○○ | ○ | ○ | ○○ | x | Δ |

TABLE 6

|  |  |  | Example |  | Comparative Example |
|---|---|---|---|---|---|
|  |  |  | 25 | 26 | 8 |
| Composition (parts by weight) | Curable resin | Biphenyl epoxy resin (available from Nippon Kayaku Co., Ltd., "NC-3000") | 7.8 | 7.8 | 7.8 |
|  |  | Naphthalene epoxy resin (available from DIC Corporation, "HP-4032D") | 1.3 | 1.3 | 1.3 |
|  |  | Bisphenol F epoxy resin (available from DIC Corporation, "EPICLON EXA-830CRP") | 1.5 | 1.5 | 1.5 |
|  |  | Naphthalene epoxy resin (available from Nippon Steel & Sumikin Chemical Co., Ltd., "ESN-475V") | 3.0 | 3.0 | 3.0 |
|  | Curing agent | Active ester curing agent (available from DC Corporation, "EPICLON EXB-9416-70BK") | 8.7 | 8.7 | 8.7 |
|  |  | Phenol curing agent (available from Meiwa Plastic Industries, Ltd., "MEH7851-4H") | 2.3 | 2.3 | 2.3 |
|  |  | Imide oligomer composition P | 3.8 | — | — |
|  |  | Imide oligomer composition Q | — | 3.8 | — |
|  |  | Imide oligomer composition S | — | — | 3.8 |
|  | Thermoplastic resin | Phenoxy resin (available from Mitsubishi Chemical Corporation, "YX6954BH30") | 1.0 | 1.0 | 1.0 |
|  | Curing accelerator | 2-phenyl-benzyl-1H-imidazole (available from Shikoku Chemicals Corporation, "1B2PZ", melting point 40° C.) | 0.6 | 0.6 | 0.6 |
|  | Inorganic filler | Silica (available from Admatechs Company Limited, "SC4050-HOA") | 70.0 | 70.0 | 70.0 |
| Amount of imide oligomer in 100 parts by weight of total of curable resin and curing agent containing imide oligomer (parts by weight) |  |  | 17 | 17 | 17 |
| Evaluation | Before curing (B stage) | Flexibility | ○ | ○ | x |
|  | After curing | Dielectric characteristics (dielectric loss tangent) | ○○ | ○○ | ○ |
|  |  | Desmear performance | ○ | ○ | x |
|  |  | Plating adhesiveness | ○○ | ○○ | Δ |

INDUSTRIAL APPLICABILITY

The present invention can provide a curable resin composition excellent in flexibility and processability before curing and excellent in adhesiveness, heat resistance, and dielectric characteristics after curing. The present invention can provide an adhesive, an adhesive film, a circuit board, an interlayer insulating material, and a printed wiring board each produced using the curable resin composition.

The invention claimed is:

1. A curable resin composition comprising:
a curable resin; and
a curing agent containing an imide oligomer,
the imide oligomer containing an aliphatic diamine residue- and/or aliphatic triamine residue-containing imide oligomer that has, in a main chain, an imide skeleton and a substituted or unsubstituted aliphatic diamine residue having a carbon number of 4 or greater and/or a substituted or unsubstituted aliphatic triamine residue having a carbon number of 4 or greater, has a crosslinkable functional group at an end, and has a molecular weight of 3,000 or less, and
the aliphatic diamine residue and/or the aliphatic triamine residue being an aliphatic diamine residue and/or an aliphatic triamine residue derived from a dimer acid and/or a trimer acid,
wherein the crosslinkable functional group is at least one selected from the group consisting of an acid anhydride group and an active ester group.

2. The curable resin composition according to claim 1, wherein the proportion of the aliphatic diamine residue and/or aliphatic triamine residue in polyvalent amine residues contained in the entire imide oligomer is 5 mol % or more.

3. The curable resin composition according to claim 1, wherein the aliphatic diamine residue- and/or aliphatic triamine residue-containing imide oligomer has a substituted or unsubstituted aromatic tetracarboxylic acid residue in the main chain.

4. The curable resin composition according to claim 1, wherein the aliphatic diamine residue- and/or aliphatic triamine residue-containing imide oligomer has a melting point of 120° C. or lower.

5. The curable resin composition according to claim 1, wherein the amount of the imide oligomer in 100 parts by weight of the total of the curable resin and the curing agent containing an imide oligomer is 5 parts by weight or more and 85 parts by weight or less.

6. The curable resin composition according to claim 1, wherein the curable resin contains an epoxy resin.

7. The curable resin composition according to claim 1, which has a glass transition temperature before curing of 0° C. or higher and lower than 25° C.

8. The curable resin composition according to claim 1, wherein a cured product of the curable resin composition has a glass transition temperature of 100° C. or higher and lower than 250° C.

9. The curable resin composition according to claim 1, wherein a cured product of the curable resin composition has an initial adhesive force to polyimide of 3.4 N/cm or more and the cured product after storage at 200° C. for 100 hours has an adhesive force to polyimide of 3.4 N/cm or more.

10. An adhesive comprising the curable resin composition according to claim 1.

11. An adhesive film produced using the curable resin composition according to claim 1.

12. A circuit board comprising a cured product of the curable resin composition according to claim 1.

13. An interlayer insulating material produced using the curable resin composition according to claim 1.

14. A multilayer printed wiring board comprising:
a circuit board;
multiple insulating layers provided on the circuit board; and
a metal layer provided between the insulating layers,
the insulating layers containing a cured product of the interlayer insulating material according to claim 13.

* * * * *